United States Patent
Ohnuma

(10) Patent No.: US 8,048,729 B2
(45) Date of Patent: Nov. 1, 2011

(54) METHOD FOR MANUFACTURING SEMICONDUCTOR DEVICE

(75) Inventor: Hideto Ohnuma, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/838,125

(22) Filed: Jul. 16, 2010

(65) Prior Publication Data

US 2010/0279477 A1 Nov. 4, 2010

Related U.S. Application Data

(63) Continuation of application No. 12/131,151, filed on Jun. 2, 2008, now Pat. No. 7,772,054.

(30) Foreign Application Priority Data

Jun. 15, 2007 (JP) .................................. 2007-158746

(51) Int. Cl.
*H01L 21/84* (2006.01)
(52) U.S. Cl. ................................. 438/164; 257/E21.561
(58) Field of Classification Search .......... 438/151–166; 257/E21.561
See application file for complete search history.

(56) References Cited

U.S. PATENT DOCUMENTS

| | | | |
|---|---|---|---|
| 5,079,180 A | 1/1992 | Rodder et al. | |
| 5,250,454 A * | 10/1993 | Maszara | 438/151 |
| 6,335,231 B1 | 1/2002 | Yamazaki et al. | |
| 6,429,084 B1 | 8/2002 | Park et al. | |
| 6,743,666 B1 * | 6/2004 | Chan | 438/151 |
| 6,946,371 B2 | 9/2005 | Langdo et al. | |
| 7,122,452 B2 * | 10/2006 | Pawlak | 438/528 |
| 7,238,557 B2 | 7/2007 | Hayakawa | |
| 7,247,562 B2 | 7/2007 | Ishikawa | |
| 7,692,194 B2 | 4/2010 | Yamazaki et al. | |
| 2005/0136606 A1 | 6/2005 | Rulke et al. | |
| 2007/0252210 A1 | 11/2007 | Ishikawa | |
| 2009/0020815 A1 | 1/2009 | Godo | |
| 2009/0101906 A1 | 4/2009 | Hosoya et al. | |
| 2009/0267151 A1 | 10/2009 | Ohnuma | |

FOREIGN PATENT DOCUMENTS

| | | |
|---|---|---|
| JP | 61-048975 | 3/1986 |
| JP | 05-110099 | 4/1993 |
| JP | 5-110099 | 4/1993 |

OTHER PUBLICATIONS

He, et al., "Raised Source and Drain Structure of Poly-SI TFTS", Electrochemical Society Proceedings, vol. 98-22, pp. 204-220, (1999).

* cited by examiner

*Primary Examiner* — Richard A. Booth
(74) *Attorney, Agent, or Firm* — Nixon Peabody LLP; Jeffrey L. Costellia

(57) ABSTRACT

A highly responsive semiconductor device in which the sub-threshold swing (S value) is small and reduction in on-current is suppressed is manufactured. A semiconductor layer in which a thickness of a source region or a drain region is larger than that of a channel formation region is formed. A semiconductor layer having a concave-convex shape which is included in the semiconductor device is formed by the steps of forming a first semiconductor layer over a substrate; forming a first insulating layer and a conductive layer over the first semiconductor layer; forming a second insulating layer over a side surface of the conductive layer; forming a second semiconductor layer over the first insulating layer, the conductive layer and the second insulating layer; etching the second semiconductor layer using a resist formed partially as a mask; and performing heat treatment to the first semiconductor layer and the second semiconductor layer.

22 Claims, 17 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In recent years, there has been extensive production of semiconductor devices in which a thin film transistor (hereinafter, also referred to as a TFT) is formed over a substrate which has an insulating surface such as a glass substrate and used as a switching element or the like. A structure of the thin film transistor has been proposed in which a semiconductor film having an island shape is formed over a substrate having an insulating surface by a CVD method, a photolithography method, or the like, and part of the semiconductor film having an island shape is used as a channel formation region of the transistor.

With such a backdrop, a method for manufacturing a thin film transistor in which a subthreshold swing (here, the subthreshold swing (S value) refers to the value of a gate voltage in a subthreshold region, which is required for changing drain current by one digit at a constant drain voltage) is decreased by thinning a thickness of a semiconductor film has been proposed in order to improve characteristics of a thin film transistor. However, by thinning the thickness of the semiconductor film, there is a problem in that resistance in the source region and the drain region and a contact resistance is increased which leads to reduction in on-current.

In order to solve these problems, a thin film transistor using a semiconductor layer in which a thickness of a channel formation region is made to be smaller than that of a source region or a drain region has been proposed (for example, Patent Document 1: Japanese Published Patent Application No. S61-48975 and Patent Document 2: Japanese Published Patent Application No. H5-110099, and Non-Patent Document 1: Electrochemical Society Proceedings Volume 98-22, PP. 204 to 220.

SUMMARY OF THE INVENTION

However, in a conventional method, as described in Patent Document 1, there is a problem in that a step is unstable because a semiconductor layer needs to be etched as selected in order to form a channel formation region with a predetermined thickness, in order to form over a surface of a flat insulating substrate a semiconductor layer in which the thickness of the channel formation region is smaller than that of the source region or the drain region. In a method described in Patent document 2, the number of steps is increased since an etching treatment is performed to planarize a surface of the semiconductor layer. In a method described in Non-Patent Document 1, the number of steps is increased since the semiconductor layer needs to be etched after being deposited twice. In particular, when an N-channel transistor and a P-channel transistor are formed, the number of times the semiconductor layer is deposited and the number of times the semiconductor layer is etched increase even more. Further, there is a problem in that it is difficult to control the thickness of the channel formation region when the channel formation region is formed to have a thickness of less than or equal to 50 nm.

The present invention provides a technique for solving such problems. It is an object of the present invention to provide a method for manufacturing a highly responsive semiconductor device in which the subthreshold swing (S value) is small and reduction in on-current is suppressed without complicated steps.

A semiconductor layer used for a semiconductor device of the present invention is formed so that a thickness of a source region or a drain region is larger than that of a channel formation region. Such a semiconductor device can be manufactured by forming a first semiconductor layer over a substrate; forming a first insulating layer over the first semiconductor layer; forming a conductive layer over the first insulating layer; forming a second insulating layer over a side surface of the conductive layer; forming a second semiconductor layer over the first semiconductor layer, the conductive layer and the second insulating layer; forming a resist partially over the second semiconductor layer; etching the second semiconductor layer using the resist as a mask; and performing a heat treatment to the first semiconductor layer and the second semiconductor layer.

Further, a semiconductor device of the present invention can be manufactured by forming a first semiconductor layer over a substrate; forming a first insulating layer over the first semiconductor layer; forming a conductive layer over the first insulating layer; forming a second insulating layer over a side surface of the conductive layer; forming a second semiconductor layer over the first semiconductor layer, the conductive layer and the second insulating layer; forming a resist partially over the second semiconductor layer; etching the second semiconductor layer using the resist as a mask; performing a heat treatment to the first semiconductor layer and the second semiconductor layer to form a semiconductor layer having a concavo-convex shape; forming a third insulating layer over the semiconductor layer having a concavo-convex shape; forming a contact hole which reaches the semiconductor layer having a concavo-convex shape in the third insulating layer; and forming a conductive layer which is electrically connected to the semiconductor layer having a concavo-convex shape through the contact hole over the third insulating layer.

Note that an insulating layer may be formed over the conductive layer before formation of the second insulating layer. Further, an impurity element may be added to the first semiconductor layer before formation of the second insulating layer. An impurity element may be added to the second semiconductor layer before heat treatment. Heat treatment can be performed by a thermal annealing method using an annealing furnace, a laser annealing method, a lamp annealing method or a rapid thermal annealing method.

In a semiconductor device of the present invention, the thickness of a source region or a drain region is larger than that of a channel formation region, which is advantageous in restoring the crystallinity in a heat treatment for thermal activation of an impurity element that is performed after addition of the impurity element by an ion doping method, an ion implantation method or the like. An increase in resistance of the source region or the drain region can be suppressed by restoring the crystallinity effectively. Further, since the thickness of the channel formation region is smaller than that of the source region or the drain region, the subthreshold swing (S value) can be decreased and reduction in on-current can be suppressed. Furthermore, since the semiconductor layer having a concavo-convex shape is formed by stacking semiconductor layers, the thickness can be easily controlled. Accordingly, a highly responsive semiconductor device in which the subthreshold swing (S value) is small and reduction in on-current is suppressed can be manufactured easily.

DETAILED DESCRIPTION OF THE INVENTION

Figure 1A:
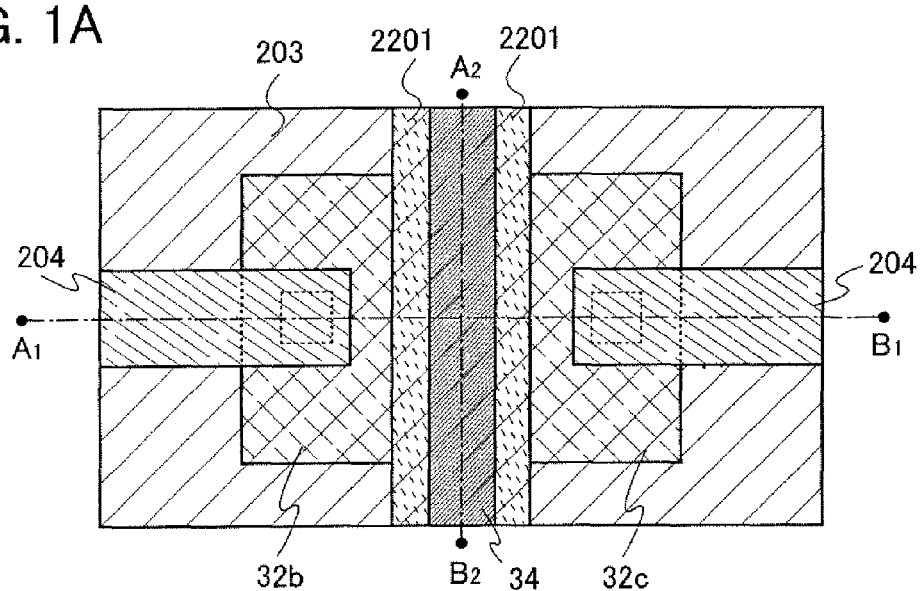
FIG. 1A is a top view and FIGS. 1B and 1C are cross-sectional views for describing a structure of a semiconductor device of the present invention.

Embodiment Modes of the present invention will be described hereinafter with reference to the accompanying drawings. However, the present invention is not limited to the description given hereinafter, and it is to be easily understood to those skilled in the art that various changes and modifications can be made without any departure from the spirit and scope of the present invention. Therefore, the present invention is not to be construed as being limited to the description of the embodiment modes given hereinafter. Note that, in structures of the present invention described below, there are cases in which the same reference numerals are used in common to denote the same components in different drawings.

Embodiment Mode 1

This embodiment mode will describe a structure and a manufacturing method of a semiconductor device using a semiconductor layer in which the thickness of a source region or a drain region is larger than that of a channel formation region.

Figure 1B:
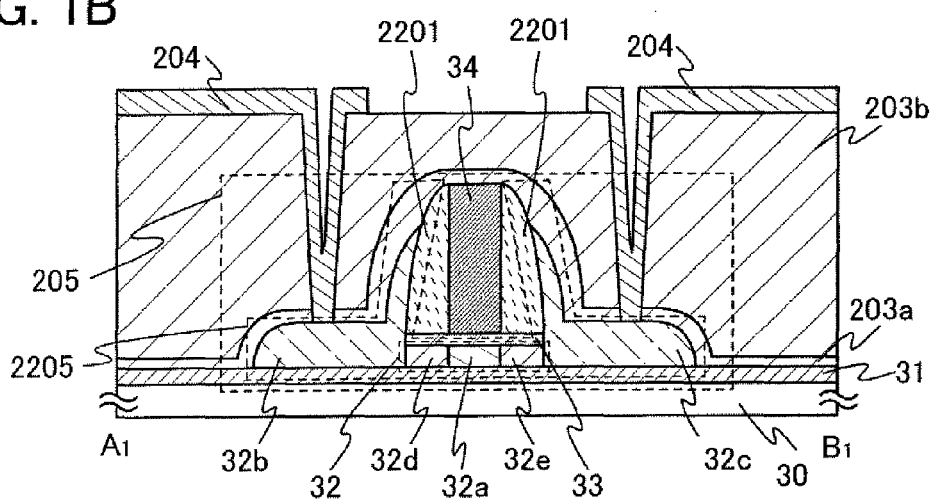
Figure 1C:
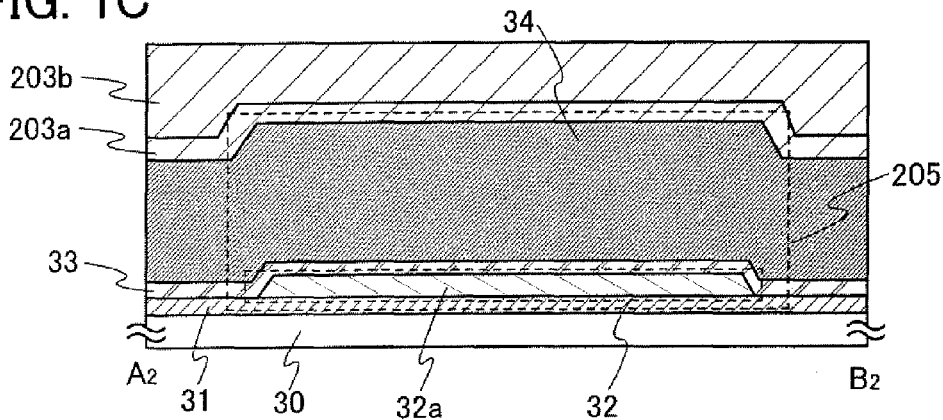

FIG. 1A is a top view and FIGS. 1B and 1C are cross-sectional views for describing a structure of a semiconductor device according to the present invention. FIG. 1A is a top view of a semiconductor device including a thin film transistor. FIG. 1B is a cross-sectional view taken along the broken line joining a dot $A_1$ and a dot $B_1$ in FIG. 1A and FIG. 1C is a cross-sectional view taken along the broken line joining a dot $A_2$ and a dot $B_2$ in FIG. 1A.

A semiconductor device described in this embodiment mode includes a thin film transistor 205 which has an insulating layer 31 formed over a substrate 30, a semiconductor layer 2205 having a first semiconductor layer 32 having an island shape and impurity regions 32b and 32c each serving as a source region or a drain region formed over the insulating layer 31, a gate insulating layer 33 formed over the first semiconductor layer 32, and a conductive layer 34 serving as a gate electrode formed over the first semiconductor layer 32 with the gate insulating layer 33 interposed therebetween; insulating layers (also referred to as sidewalls) 2201 which are in contact with side surfaces of the conductive layer 34; an insulating layer 203a formed so as to cover the gate insulating layer 33, the conductive layer 34 and the insulating layers 2201; an insulating layer 203b formed over the insulating layer 203a; and a conductive layer 204 serving as a source electrode or a drain electrode formed over the insulating layer 203b (FIGS. 1A to 1C). In FIG. 1A, an insulating layer 203 includes an insulating layer 203a and an insulating layer 2031b. Note that the first semiconductor layer 32 having an island shape includes a channel formation region 32a and impurity regions (also referred to as low-concentration impurity regions) 32d and 32e to which an impurity element is added at a lower concentration than the impurity regions 32b and 32c. Note that an impurity element that imparts the same conductivity type as an impurity element added to the impurity regions 32b and 32c or an impurity element that imparts an opposite conductivity type to the impurity regions 32b and 32c may be added to the channel formation region 32a.

The semiconductor device shown in FIGS. 1A to 1C has a feature that it has a semiconductor layer in which the thickness of a source region or a drain region is larger than that of a channel formation region. In this embodiment mode, first, a second semiconductor layer is formed over a position corresponding to a source region or a drain region of the first semiconductor layer. Then, heat treatment is performed by a laser annealing method, an RTA method, or the like, whereby crystal growth or epitaxial growth of the second semiconductor layer occurs, a crystalline state of the first semiconductor layer is reflected and the second semiconductor layer of which resistance is lowered to be n-type or p-type can be formed. Thus, the semiconductor layer in which the thickness of the source region or the drain region is larger than that of the channel formation region can be formed. Since the thickness of the source region or the drain region is larger than that of the channel formation region, the semiconductor layer has an advantage in restoring the crystallinity in heat treatment for thermal activation of an impurity element which is performed after addition of the impurity element by an ion doping method, or the like. An increase in resistance of the source region or the drain region can be suppressed by restoring the crystallinity efficiently. Further, since the thickness of the channel formation region is smaller than that of the source region or the drain region, the subthreshold swing (S value) can be decreased and reduction in on-current can be suppressed. Furthermore, since the semiconductor layer having a concave-convex shape is feinted by stacking semiconductor layers, the thickness can be easily controlled. Accordingly, a highly responsive semiconductor device in which the sub-threshold swing (S value) is small and reduction in on-current is suppressed can be manufactured easily.

An example of a manufacturing process of a semiconductor device shown in FIGS. 1A to 1C will be described hereinafter with reference to FIGS. 2A to 4B. Note that FIGS. 2A to 4B are cross-sectional views taken along the broken line joining a dot $A_1$ and a dot $B_1$ in FIG. 1A.

Figure 2A:
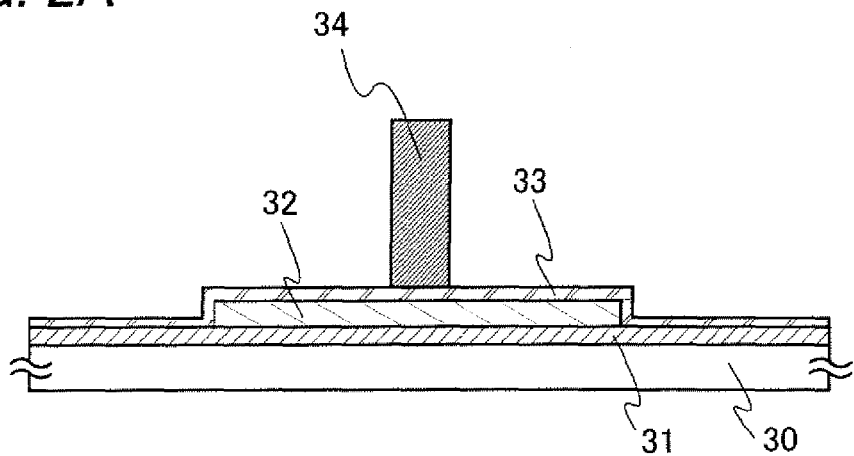
FIGS. 2A to 2C are diagrams for describing a manufacturing process of a semiconductor device of the present invention.

First, the insulating layer 31 is formed over a substrate 30 (FIG. 2A). As the substrate 30, a glass substrate, a quartz substrate, a metal substrate (for example, a stainless steel substrate or the like), a ceramic substrate, a semiconductor substrate such as a Si substrate, or the like can be used. Alternatively, a plastic substrate formed of polyethylene terephthalate (PET), polyethylene naphthalate (PEN), polyether sulfone (PES), an acrylic polymer, or the like can be selected.

The insulating layer 31 may be appropriately provided as a blocking layer which prevents an impurity element such as alkali metal from diffusing from the substrate 30 and from contaminating an element formed over the substrate 30. For example, the insulating layer 31 can be formed using an insulating layer such as a silicon oxide film, a silicon nitride film, silicon oxynitride film ($SiO_xN_y$, where x>y>0), or silicon nitride oxide film ($SiN_xO_y$, where x>y>0), by a CVD method (Chemical Vapor Deposition Method), a sputtering method, or the like. For example, when the insulating layer 31 has a two-layer structure, a silicon nitride oxide film may be formed as the insulating layer of a first layer and a silicon oxynitride film may be formed as the insulating layer of a second layer. Alternatively, a silicon nitride film may be formed as the insulating layer of a first layer and a silicon oxide film may be formed as the insulating layer of a second layer.

Next, a semiconductor layer is formed over the insulating layer 31. Then, a resist is formed as selected over the semiconductor layer and the semiconductor layer is etched using the resist as a mask, whereby a first semiconductor layer 32 having an island shape is formed (FIG. 2A). Note that the resist is used as a mask during etching, and a positive photoresist, a negative photoresist, or the like can be selected as appropriate and used. Note that the resist may be formed after forming an oxide film over the semiconductor layer. The semiconductor layer can be formed using an amorphous semiconductor layer or a crystalline semiconductor layer. As the crystalline semiconductor layer, a layer formed by crystallizing an amorphous semiconductor layer formed over the insulating layer 31 using a heat treatment or laser light irradiation, or the like can be used. Note that silicon is preferable as a semiconductor material for forming a semiconductor layer. Alternatively, silicon germanium or the like can be used.

When the semiconductor layer is crystallized by laser light irradiation, an LD excitation (laser diode excitation) continuous wave (CW) laser ($YVO_4$, second harmonic (wavelength of 532 nm)) can be used as a light source of the laser light. Although the wavelength is not specifically limited to the second harmonic, the second harmonic is superior to harmonics higher than that in terms of energy efficiency.

When the semiconductor layer is irradiated with a CW laser, energy can be continuously applied to the semiconductor layer; therefore, once the semiconductor layer is in a melted state, the melted state can be continued. Moreover, a solid-liquid interface of the semiconductor layer can be moved by scanning the CW laser, and crystal grains which are long in one direction along this moving direction can be formed. Note that not only a CW laser but also a pulsed laser with a repetition rate of greater than or equal to 10 MHz can be used. With a pulsed laser having a high repetition rate, when the pulse interval of the laser is set to be shorter than a period for solidifying the melted semiconductor layer, the semiconductor layer can be in the melted state for a long time, which enables the semiconductor layer to have crystal grains that are long in one direction by the movement of the solid-liquid interface. It is also possible to employ another type of CW laser or pulsed laser with a repetition rate of greater than or equal to 10 MHz.

For example, a gas laser such as an Ar laser, a Kr laser, or a $CO_2$ laser can be used. A solid-state laser such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, or a $YVO_4$ laser can be used. Note that output of a solid-state laser is more stable than that of a gas laser; therefore, a stable treatment can be performed. Further, a ceramic laser such as a YAG laser, a $Y_2O_3$ laser, a $GdVO_4$ laser, or a $YVO_4$ laser may also be used. A metal vapor laser such as a helium-cadmium laser or the like can be used. It is preferable to emit laser light from a laser oscillator using $TEM_{00}$ (single transverse mode), since by doing so, the energy uniformity of a linear beam spot obtained on a surface that is irradiated can be increased. Further, a pulsed excimer laser may also be used.

As an etching gas for the dry etching, a fluorine-based gas, such as $CF_4$, $NF_3$, $SF_6$, or $CHF_3$; a mixed gas, in which $O_2$ gas, $H_2$ gas, or an inert gas such as He, Ar, or the like is added as appropriate to the fluorine-based gas; or the like can be used. Preferably, a mixed gas containing $CF_4$ and $O_2$, a mixed gas containing $SF_6$ and $O_2$, a mixed gas containing $CHF_3$ and He, or a mixed gas containing $CF_4$ and $H_2$ may be used. Further, the etching is not limited to dry etching; wet etching may be used. In that case, the first semiconductor layer 32 having an island shape can be fox wed by wet etching using an alkaline solution containing an organic base typified by tetramethylammonium hydroxide (TMAH). Note that when a solution such as TMAH or the like is used as an etchant, because only the semiconductor layer is etched as selected, etching can be performed without damaging the base insulating layer 31.

Subsequently, the gate insulating layer 33 is formed so as to cover the first semiconductor layer 32 (FIG. 2A). The gate insulating layer 33 can be formed using a silicon oxide film, a silicon nitride film, a silicon oxynitride film ($SiO_xN_y$, where x>y>0), silicon nitride oxide film ($SiN_xO_y$, where x>y>0), or the like. Such an insulating layer can be formed by a vapor deposition method or a sputtering method. Further, a silicon oxide film, a silicon nitride film, a silicon oxynitride film ($SiO_xN_y$, where x>y>0), a silicon nitride oxide film ($SiN_xO_y$, where x>y>0), or the like which is formed on the surface of the semiconductor layer by performing a plasma treatment on the surface of the semiconductor layer in an atmosphere which contains oxygen or an atmosphere which contains nitrogen, or the like can be used as the gate insulating layer 33. Note that a silicon oxide film formed by treatment of the surface of the semiconductor layer with oxygen radicals (there are also cases where this includes OH radicals) that are generated by plasma discharge under a gas atmosphere that contains oxygen, or a silicon nitride film formed by treatment of the surface of the semiconductor layer with nitrogen radicals (there are cases where this includes NH radicals, as well) that are generated by plasma discharge under a gas atmosphere that contains nitrogen may be used as the gate insulating layer 33.

Next, a conductive layer 34 serving as a gate electrode is formed over the gate insulating layer 33 (FIG. 2A). Here, an example is shown in which the conductive layer 34 is formed as a single layer. Of course, the conductive layer 34 may have a structure in which two, three or more layers of films formed using a conductive material are stacked. Note that although not shown here, the conductive layer 34 can be formed by etching the conductive layer which is formed so as to cover the gate insulating layer 33 as selected.

The conductive layer 34 can be formed using an element selected from tantalum (Ta), tungsten (W), titanium (Ti), molybdenum (Mo), aluminum (Al), copper (Cu), chromium (Cr), niobium (Nb), or the like, or using an alloy or a compound containing any of such elements as a main component. Alternatively, the conductive layer 34 can be formed using a semiconductor material typified by polycrystalline silicon doped with an impurity element such as phosphorus. For example, in the case where the conductive layer 34 has a stacked-layer structure including a first conductive layer and a second conductive layer, tantalum nitride may be used as the first conductive layer and tungsten may be used as the second conductive layer. Note that the conductive layer 34 is not limited to this combination. When the conductive layer 34 is formed as a stacked-layer structure, the conductive layer 34 can be provided by freely combining any of the materials described above.

Figure 2B:
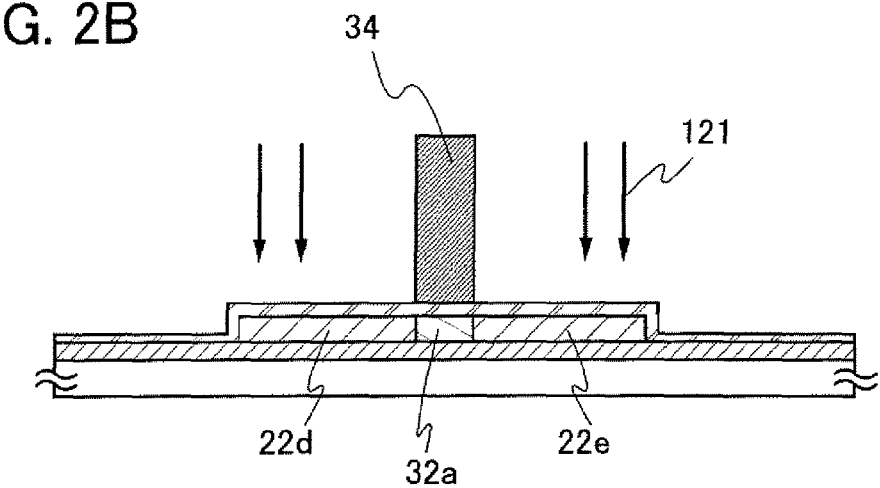

Next, by using the conductive layer 34 as a mask and introducing an impurity element 121 into the first semiconductor layer 32, impurity regions 22d and 22e and the channel formation region 32a into which the impurity element 121 is not introduced are formed (FIG. 2B). An impurity element which imparts n-type conductivity or an impurity element which imparts p-type conductivity can be used as the impurity element 121. As an impurity element which imparts n-type conductivity, phosphorus (P), arsenic (As), or the like can be used. As an impurity element which imparts p-type conductivity, boron (B), aluminum (Al), gallium (Ga), or the like can be used. Note that in this embodiment mode, because the impurity element 121 is introduced after the conductive layer 34 is formed so as to go across the first semiconductor layer 32 having an island shape, the impurity element is introduced to regions which are not covered with the conductive layer 34 to form the impurity regions 22d and 22e, and the channel formation region 32a into which the impurity element 121 is not introduced is formed in a region which is covered with the conductive layer 34.

Figure 2C:
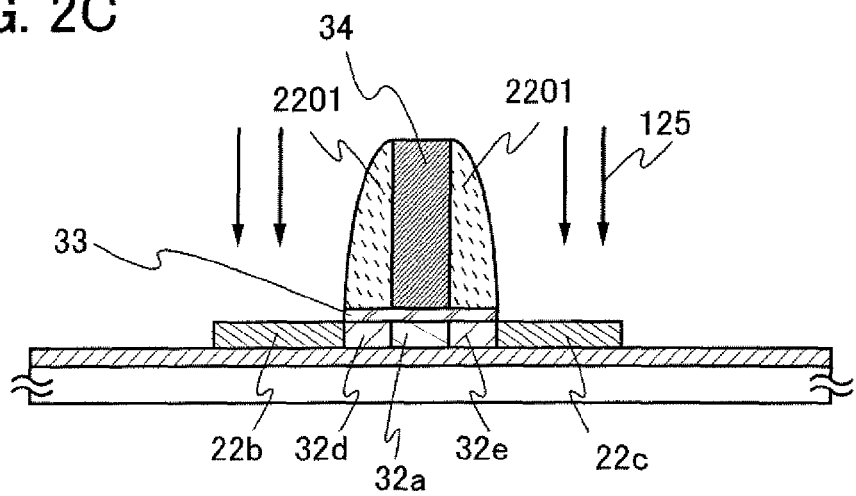

Next, an insulating layer is formed so as to cover the gate insulating layer 33 and the conductive layer 34. The insulating layer is formed as a single layer of a film containing an inorganic material such as silicon, oxide of silicon, or nitride of silicon, or a film containing an organic material such as an organic resin by a plasma CVD method or a sputtering method, or as stacked layers thereof. Then, the insulating layer is etched as selected by anisotropic etching mainly in the perpendicular direction with respect to the substrate, thereby forming insulating layers (also referred to as sidewalls) 2201 which are in contact with the side surfaces of the conductive layer 34 (FIG. 2C). Concurrently with the formation of the insulating layers 2201, the gate insulating layer 33 is etched.

Next, by introducing an impurity element 125 into the first semiconductor layer 32 using the conductive layer 34 and the insulating layers 2201 as masks, the impurity regions 22b and 22c, the impurity regions 32d and 32e and the channel formation region 32a into which the impurity element 125 is not introduced are formed (FIG. 2C). As the impurity element 125, an impurity element that imparts n-type conductivity or an impurity element that imparts p-type conductivity can be used. As an impurity element that imparts n-type conductivity, phosphorus (P), arsenic (As), or the like can be used. As an impurity element that imparts p-type conductivity, boron (B), aluminum (Al), gallium (Ga), or the like can be used. For example, as the impurity element 125, phosphorus (P) is introduced into the first semiconductor layer 32 so as to be contained at a concentration of $1\times10^{18}/cm^3$ to $1\times10^{21}/cm^3$, whereby the n-type impurity regions 22b and 22c may be formed. Note that here, because the impurity element 125 is introduced after the insulating layers 2201 and the conductive layer 34 are formed so as to go across the first semiconductor layer 32 having an island shape, the impurity element is introduced to regions which are not covered with the insulating layers 2201 and the conductive layer 34 to form the impurity regions 22b and 22c, and the impurity regions 32d and 32e and the channel formation region 32a into which the impurity element 125 is not introduced are formed in a region which is covered with the insulating layers 2201 and the conductive layer 34.

Figure 3A:
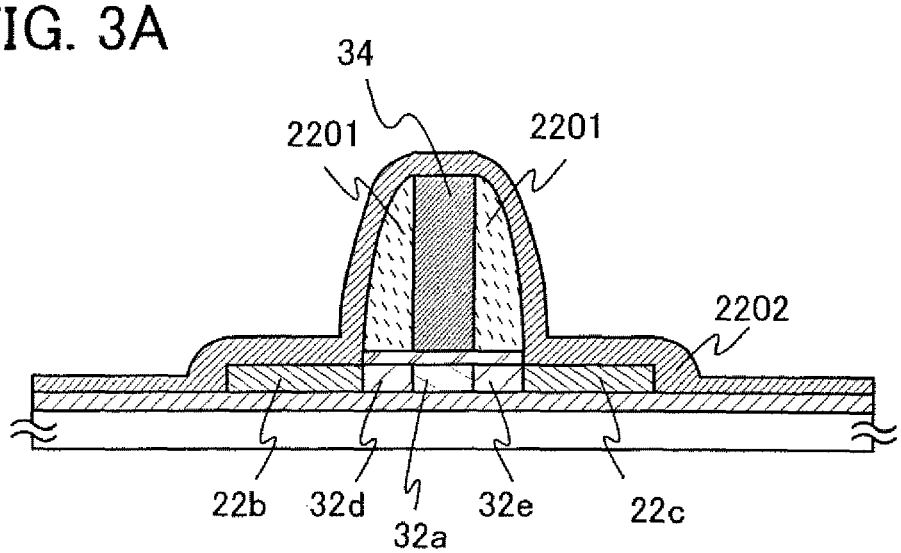
FIGS. 3A to 3C are diagrams for describing a manufacturing process of a semiconductor device of the present invention.

Next, a second semiconductor layer 2202 is formed so as to cover the conductive layer 34, the insulating layers 2201 and the first semiconductor layer 32 (FIG. 3A). Here, as the second semiconductor layer 2202, an amorphous semiconductor layer, a crystalline semiconductor layer, or the like can be used.

Figure 3B:
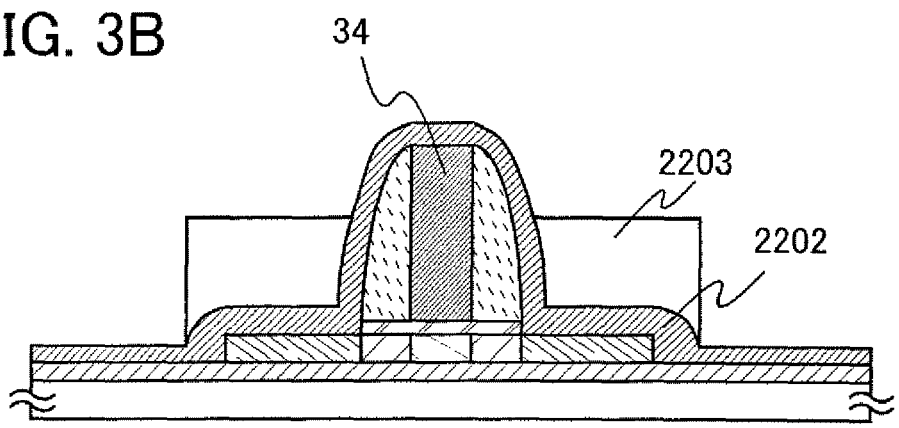

Next, a resist 2203 is formed over the second semiconductor layer 2202 as selected so as to cover at least the first semiconductor layer 32 (FIG. 3B). Here, the resist 2203 is preferably formed so as not to cover a surface of the second semiconductor layer 2202 formed over the conductive layer 34 serving as a gate electrode. In other words, the resist 2203 is preferably formed to have a thickness which is smaller than the total thickness of the conductive layer 34 and the second semiconductor layer 2202 formed over the conductive layer 34. That is, a portion which is not covered with the resist 2203 (an opening portion) is formed over the conductive layer 34 in a self-aligned manner. For example, the resist 2203 is formed to have almost the same thickness as the conductive layer 34 serving as a gate electrode, whereby the second semiconductor layer 2202 formed over the conductive layer 34 can be easily etched. If a resist is formed thinly over the conductive layer 34, the whole resist is thinned by an ashing treatment using an $O_2$ gas, or the like, so that the resist over the conductive layer 34 may be removed. Note that the resist 2203 is used as a mask during etching, and a positive photoresist, a negative photoresist, or the like can be selected as appropriate and used.

Next, the second semiconductor layer 2202 is etched using the resist 2203 as a mask. For etching, dry etching or wet etching can be used. As an etching gas for the dry etching, a fluorine-based gas such as $CF_4$, $NF_3$, $SF_6$, or $CHF_3$; a mixed gas in which $O_2$ gas, $H_2$ gas, or an inert gas such as He or Ar is added as appropriate to the fluorine-based gas; or the like can be used. Preferably, a mixed gas containing $CF_4$ and $O_2$, a mixed gas containing $SF_6$ and $O_2$, a mixed gas containing $CHF_3$ and He, or a mixed gas containing $CF_4$ and $H_2$ may be used. When wet etching is performed, an alkaline solution containing an organic base typified by TMAH (tetramethylammonium hydroxide) can be used with respect to the semiconductor layer. Note that when a solution of TMAH or the like is used as an etchant, because only the semiconductor layer is etched as selected, etching can be performed without damaging the base insulating layer 31. Note that the second semiconductor layer 2202 may be formed over the first semiconductor layer 32 so as to electrically connect with at least a conductive layer 204 serving as a source electrode or a drain electrode that is formed later. Further, the second semiconductor layer 2202 may be formed to be asymmetrical with respect to the conductive layer 34 serving as a gate electrode.

Figure 3C:
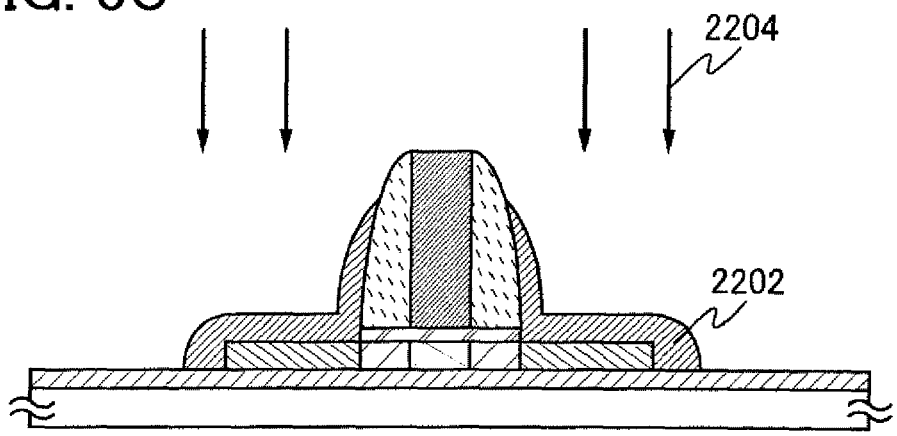

Next, an impurity element 2204 is introduced into the second semiconductor layer 2202 (FIG. 3C). For introducing the impurity element 2204, an ion doping method, an ion implantation method, or the like is used. Note that an ion doping method refers to a method in which an object is irradiated with ions which are generated from a source gas without being subjected to mass separation and an element constituting the ions is added into the object. An ion implantation method refers to a method in which ions that are generated from a material are mass-separated and an object is irradiated with selected ions and an element constituting the ions is added into the object. As the impurity element 2204, an impurity element that imparts n-type conductivity or an impurity element that imparts p-type conductivity can be used. As an impurity element that imparts n-type conductivity, phosphorus (P), arsenic (As), or the like can be used. As an impurity element that imparts p-type conductivity, boron (B), aluminum (Al), gallium (Ga), or the like can be used.

Figure 4A:
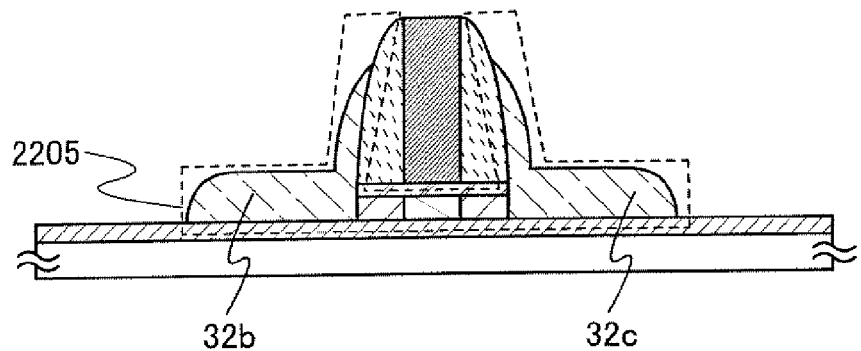
FIGS. 4A and 4B are diagrams for describing a manufacturing process of a semiconductor device of the present invention.

Next, by a heating treatment, restoration of crystallinity of the semiconductor layers and activation of the impurity elements added to the semiconductor layers are performed. For this heat treatment, a thermal annealing method using an annealing furnace, a laser annealing method, a lamp annealing method, a rapid thermal annealing method (RTA method), or the like can be used. By this heat treatment, crystallization of the second semiconductor layer 2202 proceeds by epitaxial growth reflecting a crystalline state of the first semiconductor layer 32, so that a semiconductor layer 2205 is formed (FIG. 4A). The semiconductor layer 2205 includes an impurity region 32b where crystal growth proceeds from the impurity region 22b and an impurity region 32c where crystal growth proceeds from the impurity region 22e. The impurity regions 32b and 32c serve as a source region or a drain region of the semiconductor layer 2205.

Through the above processes, the island-shaped semiconductor layer 2205 having a concavo-convex portion (a step) can be formed. Note that in this embodiment mode, the semiconductor layer 2205 has a concavo-convex shape, the thickness of a concave portion (a portion of which thickness is small) of the semiconductor layer is set to be about 10 nm to 200 nm, preferably about 10 nm to 50 nm, more preferably about 10 nm to 30 nm. Since it is easier to manufacture a complete depletion type TFT when the thickness of the concave portion of the semiconductor layer is set to be approximately less than or equal to 50 nm, a TFT whose threshold voltage is controlled while keeping a good subthreshold swing can be manufactured.

Figure 4B:
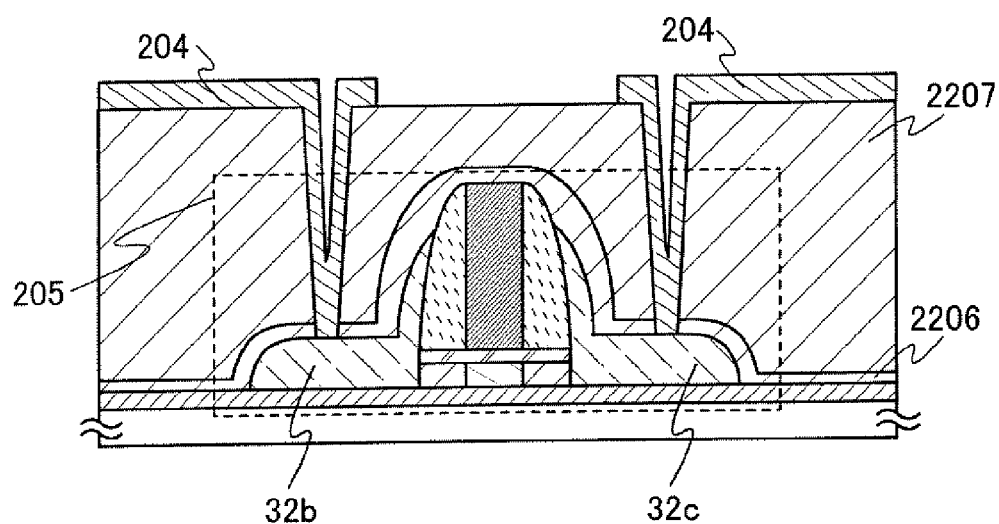

Next, insulating layers 2206 and 2207 are formed so as to cover the conductive layer 34, the insulating layers 2201, the semiconductor layer 2205, and the like (FIG. 4B). Then, contact holes are formed in the insulating layers 2206 and 2207 and the conductive layers 204 serving as a source electrode or a drain electrode are formed as selected over the insulating layer 2207 (FIG. 4B). The conductive layers 204 are provided so as to electrically Connect with the impurity regions 32b and 32c serving as a source region or a drain region of the semiconductor layer 2205.

As the insulating layers 2206 and 2207, a silicon oxide film, a silicon oxynitride film ($SiO_xN_y$, where x>y>0), a silicon nitride oxide film ($SiN_xO_y$, where x>y>0), or the like, which is formed by a CVD method, a sputtering method, or the like can be used. Alternatively, the insulating layers 2206 and 2207 can be provided using a single layer structure of a film which includes an organic material such as polyimide, polyamide, polyvinyl phenol, a benzocyclobutene polymer, an acrylic polymer, or an epoxy polymer; a siloxane material such as a siloxane resin; an oxazole resin; or the like, or as a stacked-layer structure thereof. Note that a siloxane material corresponds to a material including a Si—O—Si bond. Siloxane has a skeleton structure formed of bonds of silicon (Si) and oxygen (O). As a substituent, an organic group containing at least hydrogen (e.g., an alkyl group or aromatic hydrocarbon) can be used. Alternatively, a fluoro group can also be used as the substituent. An oxazole resin is, for example, photosensitive polybenzoxazole or the like. Photosensitive polybenzoxazole is a material which has a low dielectric constant (a dielectric constant of 2.9 at 1 MHz at room temperature), high heat resistance (according to results of thermogravimetry-differential thermal analysis (TG-DTA), it has a thermal decomposition temperature of 550° C. at a rate of temperature increase of 5° C./min), and a low water absorption percentage (0.3% at room temperature for 24 hours). Compared to a relative dielectric constant of polyimide or the like (approximately 3.2 to 3.4), an oxazole resin has a lower dielectric constant (approximately 2.9). Therefore, when an oxazole resin is used, generation of parasitic capacitance can be suppressed, and high-speed operation of a transistor can be performed. Here, the insulating layers 2206 and 2207 are formed as a single layer structure of a film including silicon oxide, silicon oxynitride ($SiO_xN_y$, where x>y>0), and/or silicon nitride oxide ($SiN_xO_y$, where x>y>0) that is foamed by a CVD method or as a stacked-layer structure thereof. Alternatively, the insulating layers 2206 and 2207 may be formed by stacking a film including an organic material such as polyimide, polyamide, polyvinyl phenol, a benzocyclobutene polymer, an acrylic polymer, or an epoxy polymer; a siloxane material such as a siloxane resin; or an oxazole resin.

For the conductive layers 204, a single-layer structure or stacked-layer structure with a film formed of one element selected from aluminum, tungsten, titanium, tantalum, molybdenum, nickel, or neodymium or formed of an alloy that contains a plurality of the elements given here can be used. For example, for a conductive film that is formed of an alloy that contains a plurality of the elements, a conductive film formed of an aluminum alloy that contains titanium, an aluminum alloy that contains neodymium, or the like can be used. Furthermore, for the case where the conductive layers 204 are each provided using a stacked-layer structure, for example, a stacked layer structure in which an aluminum layer or an aluminum alloy layer described above is interposed between titanium layers may be used, as well.

Through the above process, a semiconductor device including the thin film transistor 205 can be manufactured.

A semiconductor layer used for a semiconductor device of this embodiment mode is formed so that a thickness of a source region or a drain region is larger than that of a channel formation region. This feature is advantageous in restoring the crystallinity in a heat treatment for thermal activation of an impurity element which is performed after addition of the impurity element by an ion doping method, an ion implantation method, or the like, and an increase in resistance of the source region or the drain region can be suppressed. Further, since the thickness of the channel formation region is smaller than that of the source region or the drain region, the subthreshold swing (S value) can be decreased and reduction in on-current can be suppressed. Furthermore, since the semiconductor layer having a concavo-convex shape is formed by stacking semiconductor layers, the thickness can be easily controlled. Accordingly, a highly responsive semiconductor device in which the subthreshold swing (S value) is small and reduction in on-current is suppressed can be manufactured easily. Further, a portion which is not covered with the resist (an opening portion) is formed over the gate electrode in a self-aligned manner, and the semiconductor layer is etched using the resist as a mask, whereby the semiconductor layer having a concavo-convex shape can be formed; therefore, a light-exposure step which needs a high level of alignment precision can be omitted, the step is stabilized, and investment in a new equipment can be suppressed. Note that a method for manufacturing a semiconductor device in this embodiment mode is particularly effective in a case where a gate length is less than or equal to 1 μm (e.g. less than or equal to 0.35 μm).

Embodiment Mode 2

This embodiment mode will describe a semiconductor device having a different structure from that described in Embodiment Mode 1 with reference to FIGS. 5A to 6C.

Figure 5A:
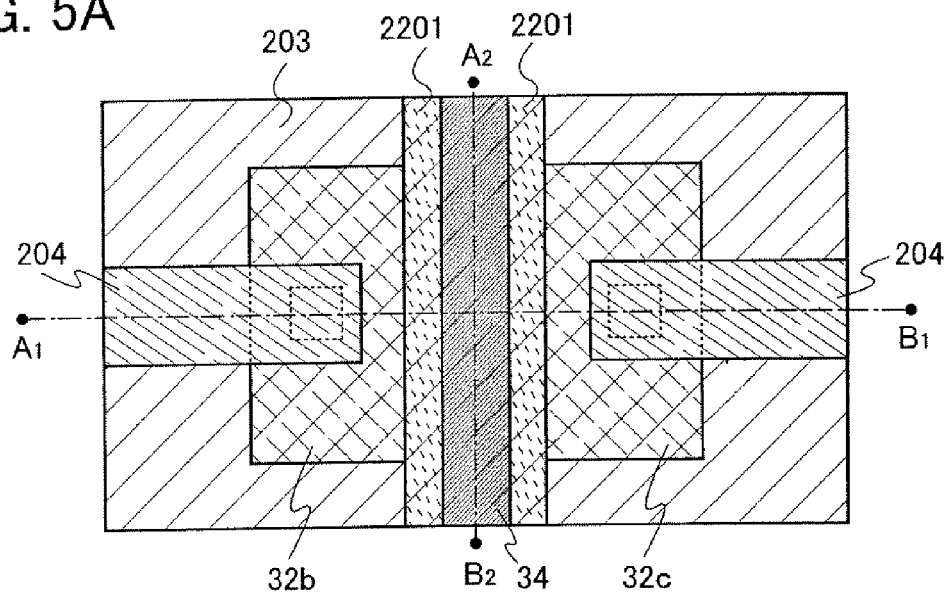
FIG. 5A is a top view and FIGS. 5B and 5C are cross-sectional views for describing a structure of a semiconductor device of the present invention.
Figure 5B:
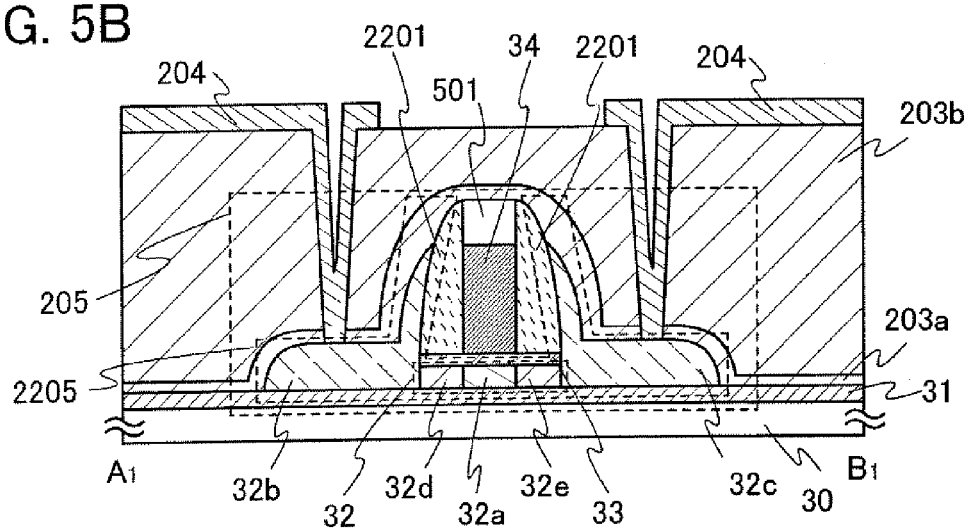
Figure 5C:
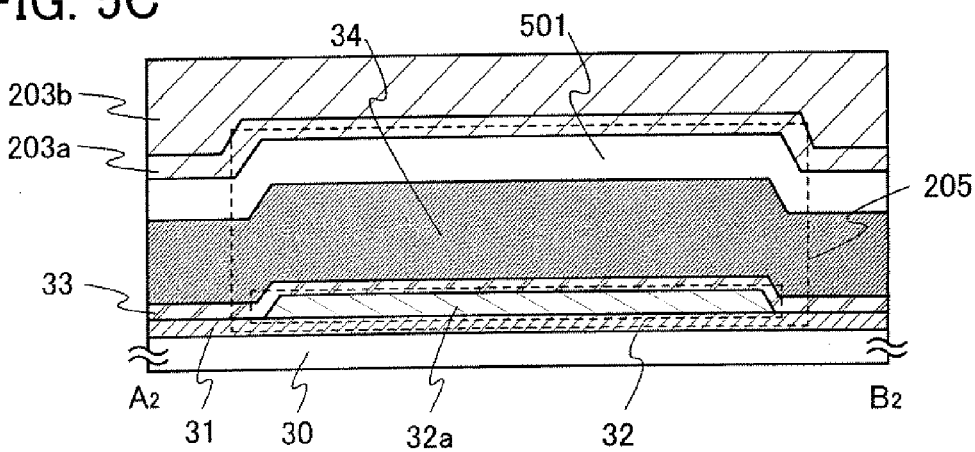

FIG. 5A is a top view and FIGS. 5B and 5C are cross-sectional views for explaining a different structure of a semiconductor device according to the present invention. The semiconductor device shown in FIGS. 5A to 5C includes an insulating layer 501 which is formed over the conductive layer 34 serving as a gate electrode in addition to the structure of the semiconductor device shown in FIGS. 1A to 1C. FIG. 5A is a top view of a semiconductor device including a thin film transistor. FIG. 5B is a cross-sectional view taken along the broken line joining a dot $A_1$ and a dot $B_1$ in FIG. 5A and FIG. 5C is a cross-sectional view taken along the broken line joining a dot $A_2$ and a dot $B_2$ in FIG. 5A.

An example of a manufacturing process of a semiconductor device shown in FIGS. 5A to 5C will be described with reference to FIGS. 6A to 6C hereinafter. Note that FIGS. 6A to 6C are cross-sectional views taken along the broken line joining a dot $A_1$ and a dot $B_1$ in FIG. 5A.

Figure 6A:
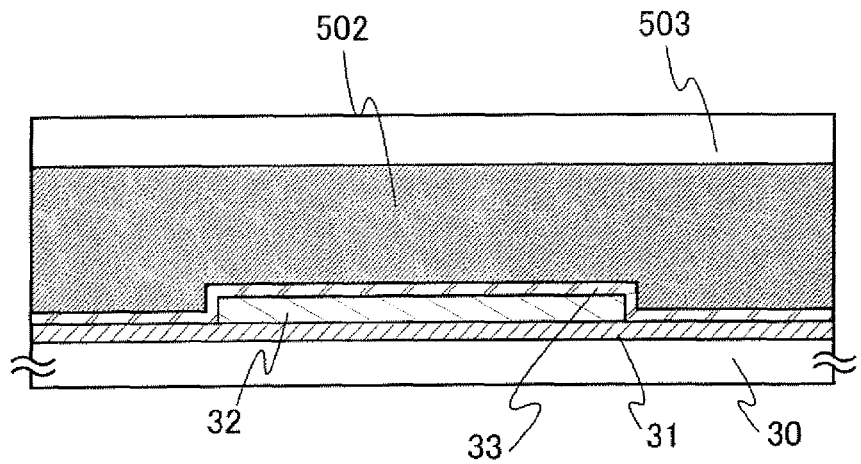
FIGS. 6A to 6C are diagrams for describing a manufacturing process of a semiconductor device of the present invention.
Figure 6B:
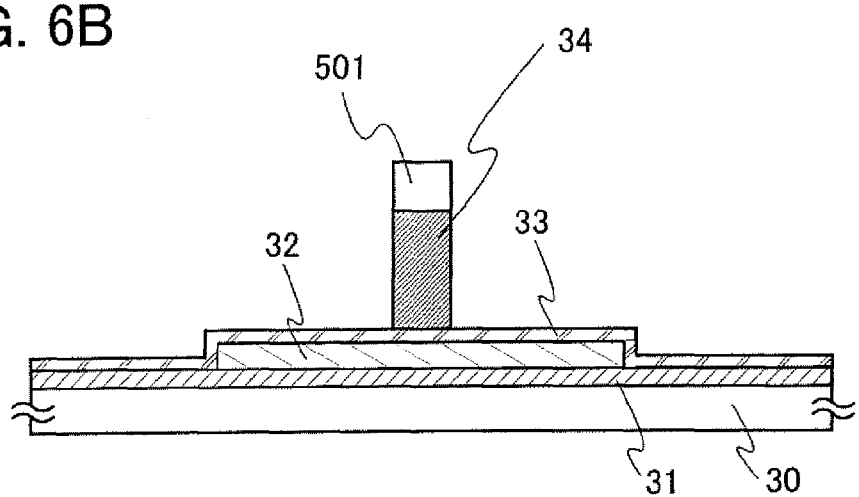
Figure 6C:
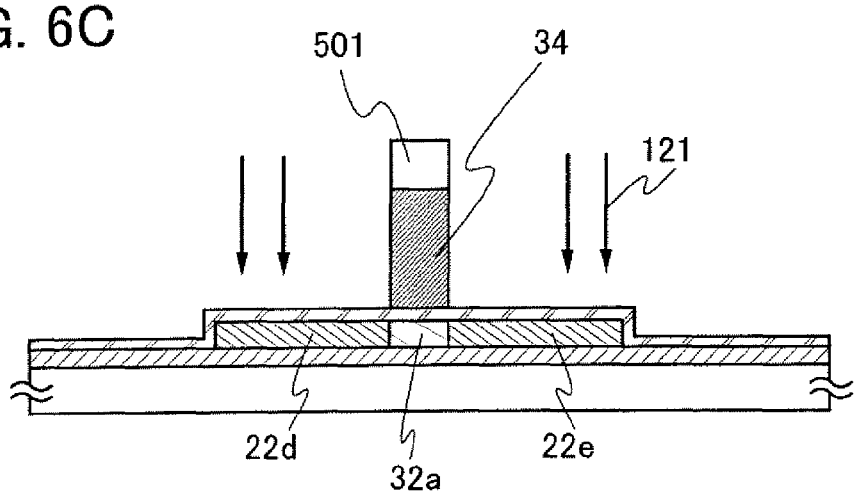

First, an insulating layer 31 is formed over a substrate 30, a first semiconductor layer 32 is formed over the insulating layer 31, and a gate insulating layer 33 is formed over the first semiconductor layer 32 (FIG. 6A). The steps up to here can be performed in a similar way to the step shown in FIG. 2A.

Next, a conductive layer 502 is formed over the gate insulating layer 33 (FIG. 6A). The conductive layer 502 can be formed using an element selected from tantalum (Ta), tungsten (W), titanium (Ti), molybdenum (Mo), aluminum (Al), copper (Cu), chromium (Cr), niobium (Nb), or the like, or using an alloy or a compound containing any of such elements as a main component. Alternatively, the conductive layer 502 can be formed using a semiconductor material typified by polycrystalline silicon doped with an impurity element such as phosphorus. For example, in the case where the conductive layer 502 has a stacked-layer structure including a first conductive layer and a second conductive layer, tantalum nitride may be used as the first conductive layer and tungsten may be used as the second conductive layer. Note that the conductive layer 502 is not limited to this combination. When the conductive layer 502 is formed as a stacked-layer structure, the conductive layer 502 can be provided by freely combining any of the materials described above.

Next, an insulating layer 503 is formed over the conductive layer 502 (FIG. 6A). Here, the insulating layer 503 can be formed using a silicon oxide film, a silicon nitride film, silicon oxynitride film ($SiO_xN_y$, where x>y>0), or silicon nitride oxide film ($SiN_xO_y$, where x>y>0). Such an insulating layer can be formed by a vapor growth method or a sputtering method.

Next, the conductive layer 502 and the insulating layer 503 are etched as selected, so that the conductive layer 34 serving as a gate electrode is formed and the insulating layer 501 is formed over the conductive layer 34 (FIG. 6B).

Then, by introducing an impurity element 121 into the first semiconductor layer 32 using the conductive layer 34 and the insulating layer 501 as masks, a channel formation region 32a into which the impurity element 121 is not introduced and impurity regions 22d and 22e are formed (FIG. 6C).

The subsequent step is performed in a similar way to that described in Embodiment Mode 1, whereby the semiconductor device shown in FIGS. 5A to 5C can be manufactured. Note that by providing the insulating layer 501, the semiconductor device in this embodiment mode has a structure in which the conductive layer 34 and impurity regions 32b and 32c are not easily short-circuited electrically.

A semiconductor layer used for a semiconductor device of this embodiment mode is formed so that a thickness of a source region or a drain region is larger than that of a channel formation region. This feature is advantageous in restoring the crystallinity in a heat treatment for thermal activation of an impurity element which is performed after addition of the impurity element by an ion doping method, or the like, and an increase in resistance of the source region or the drain region can be suppressed. Further, since the thickness of the channel formation region is smaller than that of the source region or the drain region, the subthreshold swing (S value) can be decreased and reduction in on-current can be suppressed. Furthermore, since the semiconductor layer having a concavo-convex shape is formed by stacking semiconductor layers, the thickness can be easily controlled. Accordingly, a highly responsive semiconductor device in which the sub-threshold swing (S value) is small and reduction in on-current is suppressed can be manufactured easily.

Embodiment Mode 3

This embodiment mode will describe an example of a manufacturing step of a semiconductor device using a single crystalline semiconductor layer in a channel formation region with reference to FIGS. 7A to 8D.

Figure 7A:
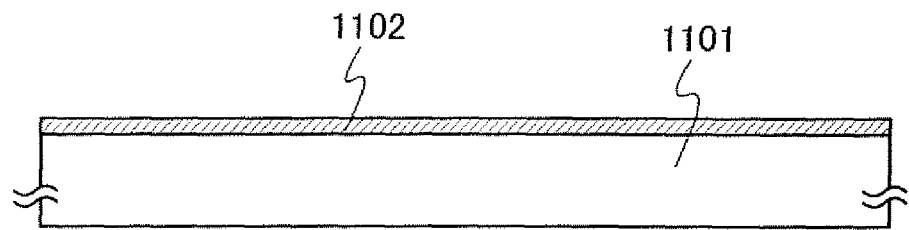
FIGS. 7A to 7C are diagrams for describing a manufacturing process of a semiconductor device of the present invention.

First, a single-crystal silicon substrate 1101 is prepared (FIG. 7A). Note that the substrate used in this embodiment mode is not limited to a single-crystal silicon substrate, and a single-crystal silicon-germanium substrate or the like may be used, as well.

Next, a silicon oxynitride (SiON) film 1102 (also referred to as a silicon oxide film that contains nitrogen) is formed over the single-crystal silicon substrate 1101 (FIG. 7A). The film thickness should be selected as appropriate by a practitioner and may be set to be from 10 nm to 500 nm, preferably, from 20 nm to 100 nm. The silicon oxynitride film 1102 functions as a part of an insulating layer of an SOI (Silicon on Insulator) substrate that is to be formed later. Note that the silicon oxynitride film 1102 can be formed using a method such as a CVD method such as a plasma CVD method, a low-pressure CVD method, or the like; a sputtering method; or the like. Note that the silicon oxynitride film 1102 can be formed on the surface of the single-crystal silicon substrate 1101 by treatment of the surface of the single-crystal silicon substrate with oxygen radicals (there are cases where this includes OH radicals, as well) that are generated by plasma discharge under a gas atmosphere that contains oxygen and then by treatment of the surface of the single-crystal silicon substrate 1101 with nitrogen radicals (there are cases where this includes NH radicals, as well) that are generated by plasma discharge under a gas atmosphere that contains nitrogen. Consequently, bonding strength in bonding of the single-crystal silicon substrate to a support substrate during a subsequent step can be increased.

A substrate in which a hydrogen-containing layer (hereinafter, referred to as an embrittled layer in this specification) is formed in the single-crystal silicon substrate by partial introduction of hydrogen may be used.

Note that the silicon oxynitride film 1102 is not necessarily provided. Instead of a silicon oxynitride film, a silicon oxide film formed using a thermal oxide film may be provided. Furthermore, a silicon oxide film may be used which is formed by a chemical vapor deposition method (a CVD method), in particular, by a plasma chemical vapor deposition method (a plasma CVD method), using a mixed gas of TEOS gas and oxygen gas. Note that, in the case where a silicon oxide film is formed by a CVD method that uses a mixed gas of TEOS gas and oxygen gas, it is preferable that the film be formed with a thickness of greater than or equal to 40 nm and less than or equal to 800 nm.

A substrate may be used in which the silicon oxynitride film and a silicon nitride oxide film are sequentially stacked over the single-crystal silicon substrate, the embrittled layer is formed in the single-crystal silicon substrate by partial introduction of hydrogen, and then a silicon oxide film is formed by a CVD method, in particular, by a plasma CVD method, using a mixed gas of TEOS gas and oxygen gas over the silicon nitride oxide film. Alternatively, a substrate may be used in which the silicon oxynitride film, the silicon nitride oxide film, and the silicon oxide film formed by a CVD method, in particular, by a plasma CVD method, using a mixed gas of TEOS gas and oxygen gas are sequentially stacked over the single-crystal silicon substrate, and then the embrittled layer is formed in the single-crystal silicon substrate by partial introduction of hydrogen.

Note that, here, "TEOS gas" refers to tetraethyl orthosilicate gas. By providing a silicon oxide film formed by a CVD method that uses TEOS gas and oxygen gas, in particular a plasma CVD method at the bonding interface of the single-crystal silicon substrate 1101 and the support substrate 1104, the adhesiveness of the substrates can be increased even more.

Note that, in the case in which the silicon oxynitride film 1102 is not formed over the single-crystal silicon substrate, it is preferable that a natural oxide film or an ultra-thin oxide film that is to be formed by irradiation of the surface of the single-crystal silicon substrate with ultraviolet light in an atmosphere that contains oxygen be formed over the surface of the single-crystal silicon substrate. Alternatively, an oxide film called a chemical oxide is preferably formed by treatment of the surface of the single-crystal silicon substrate with an oxidant such as ozone water, a solution of hydrogen peroxide, sulfuric acid, or the like. By formation of an oxide film over the single-crystal silicon substrate, etching of the surface of the single-crystal silicon substrate in the introduction of hydrogen into the single-crystal silicon substrate to be performed later can be prevented.

Figure 7B:
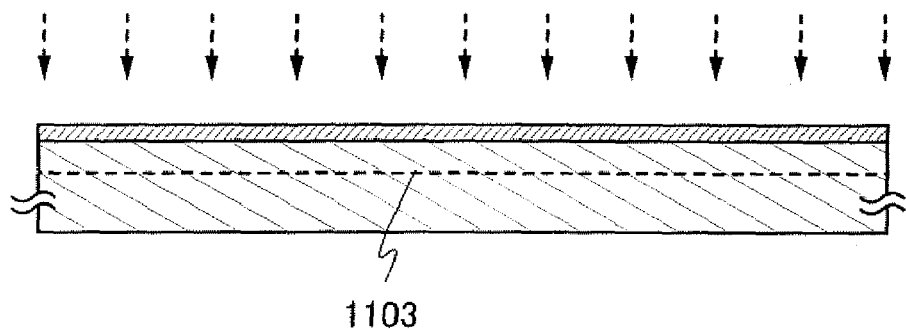

Next, hydrogen is introduced into the single-crystal silicon substrate 1101 through the silicon oxynitride film 1102 to form an embrittled layer 1103 (FIG. 7B). Note that the depth at which the embrittled layer 1103 is formed (the distance between the interface of the single-crystal silicon substrate 1101 and the silicon oxynitride film 1102 and the embrittled layer 1103) comes to be the film thickness of a single-crystal silicon layer that functions as an active layer in forming a TFT later. For example, hydrogen ions can be added at a dose of $1\times10^{16}$ ions/cm$^2$ to $1\times10^{17}$ ions/cm$^2$ using an ion implantation method so that a single-crystal silicon layer with a thickness of 50 nm is left remaining between the surface of the single-crystal silicon substrate 1101 and the embrittled layer 1103. Alternatively, hydrogen ions, with $H_3^+$ ions being the main type of ion species, may be added by use of a non-mass separated ion doping apparatus. By use of $H_3^+$ ions as the hydrogen ions, the length of time required for addition of ions can be shortened.

Note that, in this embodiment mode, treatment used to planarize the surface of the silicon oxynitride film 1102 may be performed. For example, the surface of a silicon oxynitride film 1102 can be planarized by polishing treatment that is referred to as chemical-mechanical polishing (CMP). By planarization of the surface of the silicon oxynitride film 1102, the adhesiveness between the single-crystal silicon substrate and a support substrate 1104 that are to be bonded together during a later step can be increased.

Figure 7C:
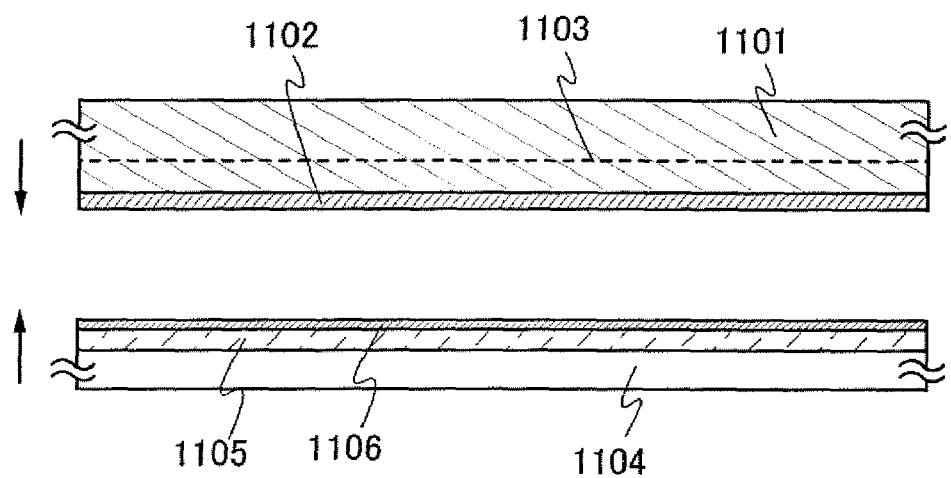

Next, the single-crystal silicon substrate 1101 and a support substrate 1104 that is prepared separately are bonded together. In this embodiment mode, a glass substrate is used as the support substrate 1104, and a silicon nitride oxide (SiNO) film 1105 (also referred to as a silicon nitride film that contains oxygen) and a silicon oxynitride (SiON) film 1106 (also referred to as a silicon oxide film that contains nitrogen) are formed over the surface of the glass substrate in the order given (FIG. 7C). Note that the silicon nitride oxide film 1105 or the silicon oxynitride film 1106 is not necessarily provided over the support substrate 1104. For example, a support substrate in which a silicon oxide film is formed over the glass substrate by a CVD method that uses a mixed gas of TEOS gas and oxygen gas, in particular a plasma CVD method may be used, as well. Furthermore, a glass substrate with a surface over which no insulating layer is formed may also be used. In this case, it is preferable that the surface of the glass substrate be cleaned.

Figure 8A:
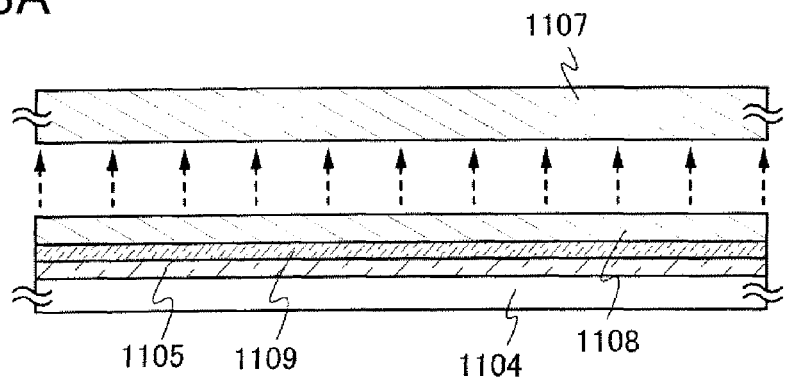
FIGS. 8A to 8D are diagrams for describing a manufacturing process of a semiconductor device of the present invention.

In this embodiment mode, the single-crystal silicon substrate 1101 and the support substrate 1104 are bonded together with the silicon oxynitride film 1102 and the silicon oxynitride film 1106 interposed therebetween, whereby a chemical bond is formed at the interface of the silicon oxynitride film 1102 and the silicon oxynitride film 1106, and a silicon oxynitride (SiON) film 1109 (also referred to as a silicon oxide film that contains nitrogen) in which the silicon oxynitride film 1102 and silicon oxynitride film 1106 are bonded together is formed (FIG. 8A).

Note that, before bonding the single-crystal silicon substrate 1101 and the support substrate 1104 together, the silicon oxynitride film 1102 formed over the single-crystal silicon substrate 1101 is irradiated with an argon ion beam in vacuum, and atoms on the surface of the silicon oxynitride film 1102 may be placed in an active state in which chemical bonding easily occurs. Here, the silicon oxynitride film 1102 can be placed in an active state by argon ions, which are generated by plasma discharge in an argon gas atmosphere, being made to collide with the surface of the silicon oxynitride film 1102. Note that the surface of the silicon oxynitride film 1102 is not limited to being placed in an active state by exposure to an argon ion beam, and the surface of the silicon oxynitride film 1102 can be placed in an active state by the surface of the silicon oxynitride film 1102 being exposed to a plasma atmosphere, X rays, or an electron beam. For a gas used in exposure of the surface of the silicon oxynitride film 1102 to a plasma atmosphere, oxygen; nitrogen; hydrogen; an inert gas such as argon, helium, or the like; a molecular gas such as ammonia or the like; or the like can be used. Note that it is preferable that the irradiation energy in irradiation of the substrate be controlled by a DC bias within a range of approximately from several volts to 400 volts. Moreover, the surface of the silicon oxynitride film 1102 may be placed in an active state by exposure to an ion atmosphere of ions that have energies of greater than or equal to 20 eV and less than 200 eV. A surface of the silicon oxynitride film 1106 formed over the support substrate 1104 may be placed in an active state in a similar way to the surface of the silicon oxynitride film 1102 provided on the single-crystal silicon substrate 1101.

By irradiation of the silicon oxynitride film 1102 provided on the single-crystal silicon substrate 1101 or the silicon oxynitride film 1106 formed over the support substrate 1104 with an argon ion beam or the like in a vacuum, an adsorbed gas, a natural oxide film, or the like that exists on the surface of the film is etched, activation for application of a bonding force used to bond substrates together at the surfaces of the substrates can be performed. Accordingly, the single-crystal silicon substrate 1101 and the support substrate 1104 can be bonded together by superposition of the substrates after that.

Note that, as the single-crystal silicon substrate 1101, instead of a glass substrate, a plastic substrate may also be used, and a flexible substrate such as a film may be used, as well. As a plastic substrate, a substrate made of polyethylene terephthalate (PET), polyethylene naphthalate (PEN), or polyethersulfone (PES) can be used; as the flexible substrate, a synthetic resin such as acrylic or the like can be used. Furthermore, a substrate, such as a quartz substrate, a ceramic substrate, a crystallized glass substrate, or the like, that has a high resistance to heat may be used as well.

Note that the silicon nitride oxide film 1105 and the silicon oxynitride film 1106 formed over the support substrate 1104 function as blocking layers by which the diffusion of an impurity element from the glass substrate can be prevented. Because glass substrates contain mobile ions that are easily transferred, providing a blocking layer is especially effective. Note that the silicon nitride oxide film 1105 and the silicon oxynitride film 1106 can be formed using a method such as a CVD method such as a plasma CVD method, a low-pressure CVD method, or the like; a sputtering method; or the like.

Here, it is preferable that a treatment used to planarize the surface of the silicon oxynitride film 1106 be performed. For example, the surface of a silicon oxynitride film 1106 can be planarized by CMP. By planarization of the surface of the silicon oxynitride film 1106, the adhesiveness between the single-crystal silicon substrate 1101 and the support substrate 1104 that are to be bonded together during a later step can be increased.

Next, a heat treatment is performed at temperatures of 400° C. to 600° C. Due to this heat treatment, changes in the volume of microcavities of the embrittled layer 1103 occur, and a fracture surface along the embrittled layer 1103 is produced and the single-crystal silicon substrate 1101 is split up, and the silicon nitride oxide film 1105, the silicon oxynitride film 1109, and a single-crystal silicon layer 1108 are left remaining over the support substrate 1104 by removal of a single-crystal silicon layer 1107 that is part of the single-crystal silicon substrate 1101 which is split up (FIG. 8A).

Next, a treatment used to planarize the surface of the single-crystal silicon layer 1108 may be performed. The planarization treatment can be performed by CMP. In this embodiment mode, the final film thickness of the single-crystal silicon layer 1108 may be set to be from 10 nm to 200 nm (preferably, from 10 nm to 70 nm, even more preferably, from 20 urn to 50 nm). Further, planarization and repair of a crystal defect of the single-crystal silicon layer 1108 may be performed by irradiation with laser light.

Figure 8B:
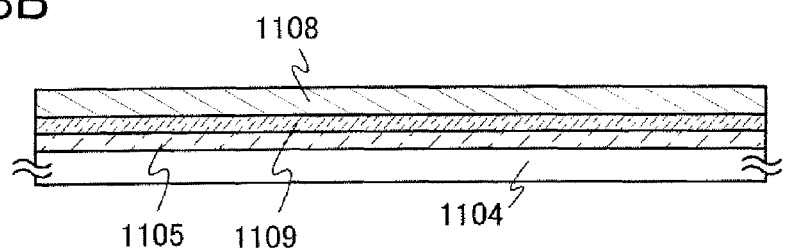

By the above steps, the SOI substrate in which the single-crystal semiconductor layer is formed over the glass substrate can be fabricated (FIG. 8B). In this embodiment mode, since the substrates to which activation is performed to provide a bonding force to surfaces thereof are superposed on each other, strong bonding can be achieved without any high temperature heat treatment being performed. Consequently, there is no need to use an expensive substrate that has a high resistance to heat, and thus, an inexpensive glass substrate, plastic substrate or the like can be used, and a reduction in manufacturing costs can be achieved. Further, by use of a silicon film that contains oxygen or nitrogen as an insulating layer interposed between the support substrate and the single-crystal silicon layer, contamination of the single-crystal silicon layer by impurities from the substrate can be prevented.

Figure 8C:
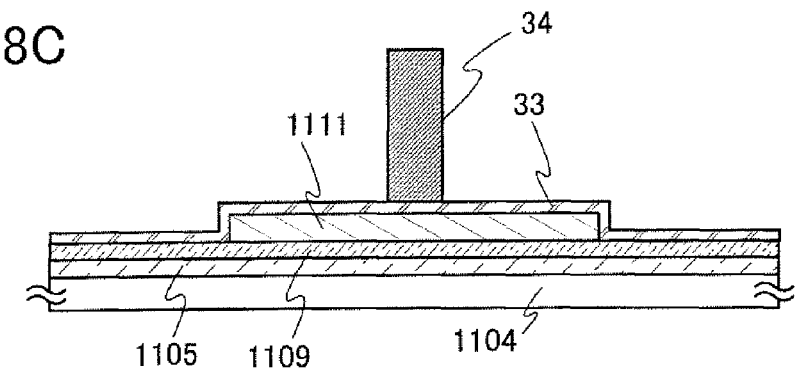

Next, a single-crystal silicon layer 1111 having an island shape is formed by patterning the single-crystal silicon layer 1108 (FIG. 8C). Then, a gate insulating layer 33 and a conductive layer 34 serving as a gate electrode are fainted over the single-crystal silicon layer 1111 having an island shape (FIG. 8C). Here, the gate insulating layer 33 and the conductive layer 34 can be formed in a similar way to the gate insulating layer 33 and the conductive layer 34 in Embodiment Mode 1.

Figure 8D:
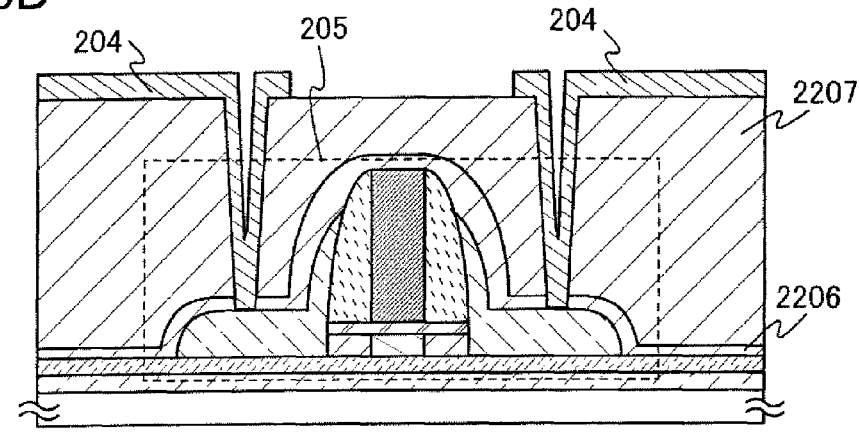

By performing the following step in a similar way to the steps shown in FIG. 2B and thereafter, a semiconductor device shown in FIG. 8D can be manufactured. The semiconductor device shown in FIG. 8D is formed using the single-crystal silicon layer in a channel formation region thereof. By using the single-crystal silicon layer in the channel formation region, a semiconductor device having excellent properties can be manufactured.

A semiconductor layer used for a semiconductor device of this embodiment mode is formed so that a thickness of a source region or a drain region is larger than that of a channel formation region. This feature is advantageous in restoring the crystallinity in heat treatment for thermal activation of an impurity element which is performed after addition of the impurity element by an ion doping method, or the like, and an increase in resistance of the source region or the drain region can be suppressed. Further, since the thickness of the channel formation region is smaller than that of the source region or the drain region, the subthreshold swing (S value) can be decreased and reduction in on-current can be suppressed. Furthermore, since the semiconductor layer having a concavo-convex shape is formed by stacking semiconductor layers, the thickness can be easily controlled. Accordingly, a highly responsive semiconductor device in which the sub-threshold swing (S value) is small and reduction in on-current is suppressed can be manufactured easily.

Note that, in this embodiment mode, an example is shown in which a silicon oxide film that contains nitrogen and a silicon nitride film that contains oxygen are interposed between a glass substrate and a single-crystal silicon layer; however, the structure of the present invention is not limited to being what is given here, and the structure of the present invention may be a single-layer structure of one layer of any of a silicon oxide film, a silicon nitride film, a silicon oxynitride film, or a silicon nitride oxide film, or the structure may be a stacked-layer structure of any of these stacked together as appropriate. Note that, in this specification, "silicon oxynitride" refers to a substance in which the proportion of oxygen is greater than the proportion of nitrogen. For example, "silicon oxynitride" can also be used to refer to silicon oxide that contains nitrogen. In addition, in this specification, "silicon nitride oxide" refers to a substance in which the proportion of nitrogen is greater than the proportion of oxygen. For example, "silicon nitride oxide" can also be used to refer to silicon nitride that contains oxygen.

For example, a silicon oxynitride film may be formed over a single-crystal silicon substrate, a silicon nitride oxide film may be formed over a glass substrate, and the single-crystal silicon substrate and the glass substrate may be bonded together with the silicon oxynitride film and the silicon nitride oxide film interposed therebetween. Alternatively, a silicon nitride oxide film and a silicon oxynitride film may be formed over the glass substrate in the order given, and the single-crystal silicon substrate and the glass substrate may be bonded together with the silicon nitride oxide film and the silicon oxynitride film interposed therebetween. In addition, a silicon oxynitride film and a silicon nitride oxide film may be formed over the single-crystal silicon substrate in the order given, and moreover, the single-crystal silicon substrate and the glass substrate may be bonded together with the silicon oxynitride film and the silicon nitride oxide film interposed therebetween. In this case, a silicon oxide film may be formed over the surface of the glass substrate by a CVD method that uses a mixed gas of TEOS gas and oxygen gas, in particular, a plasma CVD method. Furthermore, a silicon oxynitride film may be formed over the single-crystal silicon substrate, a silicon nitride oxide film and a silicon oxynitride film may be formed over the glass substrate in the order given, the single-crystal silicon substrate and the glass substrate may be bonded together by the two silicon oxynitride films being bonded together, and a silicon oxide film may be formed between the silicon oxynitride film and the silicon nitride oxide film by a CVD method that uses a mixed gas of TEOS gas and oxygen gas, in particular, a plasma CVD method. Moreover, a silicon oxide film formed by a CVD method that uses a mixed gas of TEOS gas and oxygen gas and a silicon nitride oxide film may be formed over the surface of a single-crystal silicon layer in the order given, a silicon oxide film may be formed over the surface of the glass substrate by a CVD method that uses a mixed gas of TEOS gas and oxygen gas, in particular, a plasma CVD method, and the single-crystal silicon substrate and the glass substrate may be bonded together with the silicon nitride oxide film and the silicon oxide films interposed therebetween.

Note that providing a silicon oxide film that is formed by a CVD method that uses a mixed gas of TEOS gas and oxygen gas, in particular, a plasma CVD method at the interface between the single-crystal silicon substrate and the glass substrate when the two substrates are bonded together is preferable because adhesiveness can be increased thereby. In particular, providing a silicon oxide film that is formed by a plasma CVD method at the bonding interface is preferable because bonding strength that is equal to that of a case in which a thermal oxide film treated by plasma activation is used in the bonding interface can be achieved thereby. For example, after an insulating film of a silicon nitride oxide film or the like is provided over the single-crystal silicon substrate, a silicon oxide film may be formed by a CVD method that uses a mixed gas of TEOS gas and oxygen gas, in particular, a plasma CVD method, and the silicon oxide film and the glass substrate may be bonded together. Alternatively, after an insulating layer of a silicon oxynitride film or the like is provided over the glass substrate, a silicon oxide film may be formed by a CVD method that uses a mixed gas of TEOS gas and oxygen gas, in particular, a plasma CVD method and the silicon oxide film and the single-crystal silicon substrate may be bonded together. Note that, instead of a silicon oxide film formed by a CVD method that uses a mixed gas of TEOS gas and oxygen gas, in particular a plasma CVD method, a silicon oxide film formed by a sputtering method or the like may be used, as well.

Note that a silicon nitride film has more blocking capability for the prevention of diffusion of an impurity element from a glass substrate than a silicon oxide film. On the other hand, the density of interface states generated in the interface of a base insulating layer formed in contact with the single-crystal silicon layer 1108 is lower for a silicon oxide film than for a silicon nitride film. As a consequence, it is preferable that a layer to be the base insulating layer formed in contact with the substrate be a silicon nitride film and the insulating layer formed in contact with the semiconductor layer side be a silicon oxide film. The reason for this is that, when a TFT in which a silicon nitride film is formed in contact with the semiconductor layer and an interface state is generated therebetween is manufactured, charge is trapped in the interface between the base insulating layer and the semiconductor layer, and there are wide fluctuations in threshold voltage due to the effects on electric field by the trapped charge.

Embodiment Mode 4

In this embodiment mode, a method for manufacturing a semiconductor device of the present invention which includes a thin film transistor, a memory element, and an antenna will be described with reference to the drawings.

Figure 9A:
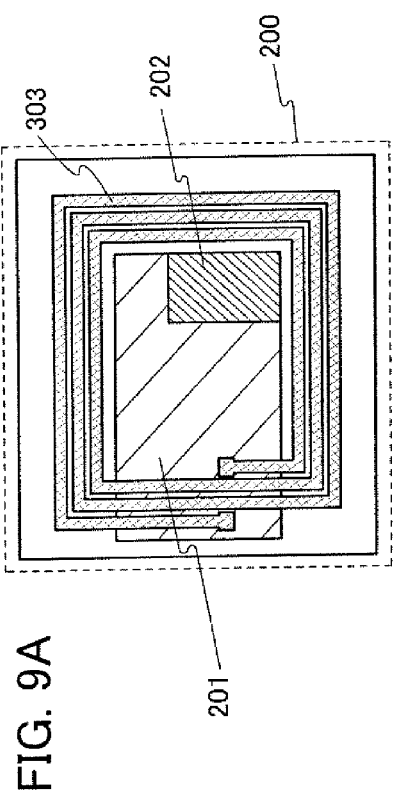
FIG. 9A is a top view and FIG. 9B is a cross-sectional view for describing a structure of a semiconductor device of the present invention.
Figure 9B:
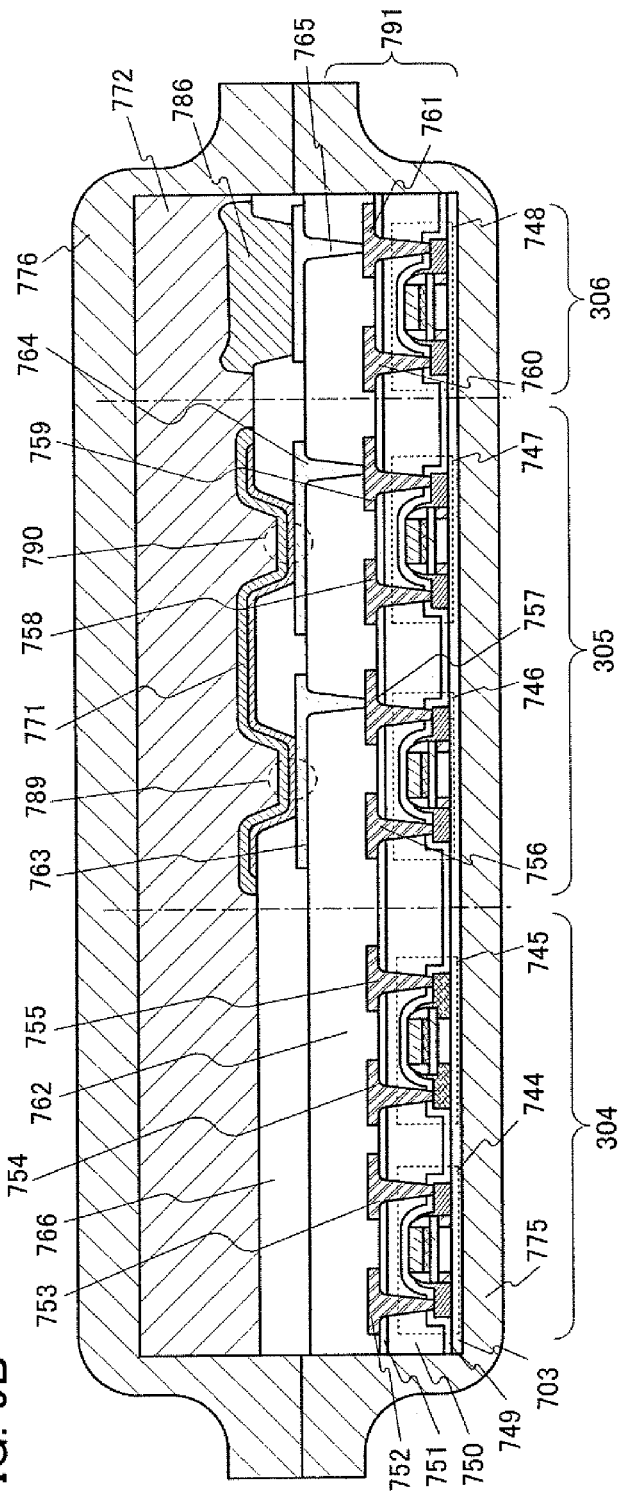

FIGS. 9A and 9B show a top view and a cross-sectional view, respectively, each illustrating a structure of a semiconductor device given in this embodiment mode. Note that an example of an upper surface structure of a semiconductor device given in this embodiment mode is shown in FIG. 9A, and a part of a cross-sectional structure of FIG. 9A is shown in FIG. 9B.

In this embodiment mode, a semiconductor device 200 includes an integrated circuit portion 201, a memory portion 202, and an antenna 303 (FIG. 9A). Note that, in FIG. 9B, a region 304 corresponds to a part of a cross-sectional structure of the integrated circuit portion 201 of FIG. 9A, a region 305 corresponds to a part of a cross-sectional structure of the memory portion 202 of FIG. 9A, and a region 306 corresponds to a part of a cross-sectional structure of the antenna 303 of FIG. 9A.

As shown in FIG. 9B, the semiconductor device of this embodiment mode includes thin film transistors 744 to 748 (TFTs) which are provided over a first base 775 with an insulating layer 703 interposed therebetween, an insulating layer 750 provided over the thin film transistors 744 to 748, and conductive layers 752 to 761 each functioning as a source electrode or a drain electrode provided over the insulating layer 750. The semiconductor device of this embodiment mode further includes an insulating layer 751 provided over the insulating layer 750; an insulating layer 762 provided over the insulating layer 751 and the conductive layers 752 to 761; conductive layers 763 to 765 provided over the insulating layer 762; an insulating layer 766 provided so as to cover a part of each of the insulating layer 762 and the conductive layers 763 to 765; memory elements 789 and 790 provided over the conductive layers 763 and 764, respectively; a conductive layer 786 that functions as an antenna provided over the conductive layer 765; an insulating layer 772 provided so as to cover the insulating layer 766, a conductive layer 771 included in the memory elements and the conductive layer 786 that functions as an antenna; and a second base 776 provided over the insulating layer 772. Note that the integrated circuit portion 201, the memory portion 202, and the antenna 303 of the semiconductor device are sealed with the first base 775 and the second base 776.

Next, an example of a manufacturing process of the semiconductor device shown in FIGS. 9A and 9B will be described with reference to FIGS. 10A to 10C, FIGS. 11A and 11B, FIGS. 12A and 12B, and FIGS. 13A and 13B.

Figure 10A:
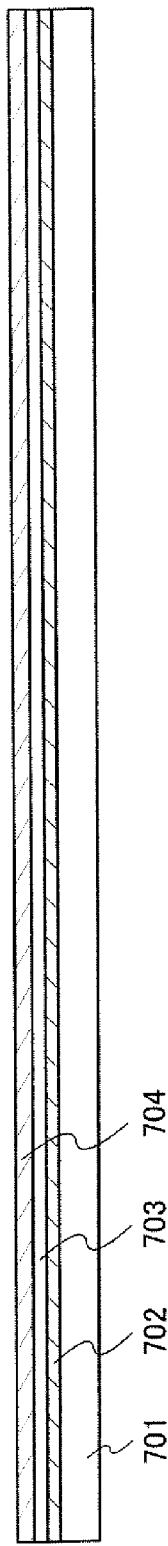
FIGS. 10A to 10C are cross-sectional views for describing a manufacturing step of a semiconductor device of the present invention.

First, a separation layer 702 is formed on a surface of a substrate 701 (FIG. 10A). The substrate 701 may be a glass substrate, a quartz substrate, a substrate in which an insulating layer is formed on a surface of a metal substrate or a stainless-steel substrate, or a plastic substrate which can withstand the treatment temperature of the manufacturing process. In the case of using such a substrate 701, there are no particular restrictions on the area or the shape thereof; therefore, for example, by using a rectangular substrate with a length of at least one meter on a side, the productivity can be dramatically improved. This merit is greatly advantageous as compared to the case of using a circular silicon substrate. In addition, the separation layer 702 is formed over an entire surface of the substrate 701 in this process; however, the separation layer may be provided as selected if necessary by using a photolithography method after a layer to serve as the separation layer is formed over the entire surface of the substrate 701. Note that the separation layer 702 is formed so as to be in contact with the substrate 701; however, if necessary, an insulating layer to be a base may be formed between the substrate 701 and the separation layer 702.

The separation layer 702 is formed as a single layer or a stack with a layer using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si), an alloy or a compound that contains the above-described element as its main component by a sputtering method, a plasma CVD method, or the like. The film that contains silicon may have any structure of amorphous, microcrystal, or polycrystalline structure.

In the case where the separation layer 702 has a single-layer structure, a film that contains tungsten, a film that contains molybdenum, or a film that contains a mixture of tungsten and molybdenum may be formed, for example. Alternatively, a film that contains oxide or oxynitride of tungsten, a film that contains oxide or oxynitride of molybdenum, or a film that contains oxide or oxynitride of a mixture of tungsten and molybdenum may be formed. Note that a mixture of tungsten and molybdenum is an alloy of tungsten and molybdenum, for example. Further, oxide of tungsten can be referred to as tungsten oxide.

In the case where the separation layer 702 has a stacked-layer structure, a film that contains tungsten, a film that contains molybdenum, or a film that contains a mixture of tungsten and molybdenum may be formed as a first layer. A film that contains oxide, nitride, oxynitride, or nitride oxide of tungsten, a film that contains oxide, nitride, oxynitride, or nitride oxide of molybdenum, or a film that contains oxide, nitride, oxynitride, or nitride oxide of a mixture of tungsten and molybdenum may be formed as a second layer.

When a stacked-layer structure of a film that contains tungsten and a film that contains oxide of tungsten is formed as the separation layer 702, the film that contains tungsten is formed and a film that contains silicon oxide may be formed thereover so that a film that contains oxide of tungsten is formed at the interface between the film that contains tungsten and the film that contains silicon oxide. This structure is also applicable to the case where a stacked-layer structure of a film that contains tungsten and a film that contains nitride, oxynitride or nitride oxide of tungsten is formed. In this case, after a film that contains tungsten is formed, a film that contains silicon nitride, a film that contains silicon oxynitride, or a film that contains silicon nitride oxide may be formed thereover. Alternatively, in the case of providing the separation layer 702 having a stacked-layer structure of a metal layer and a film that contains metal oxide, the separation layer may be formed by forming the metal layer and then treating the metal layer with plasma treatment to form a metal oxide film as a film that contains metal oxide on the metal layer. A metal oxide film, a metal oxynitride film, or the like can be formed as a film that contains metal oxide on the metal layer by performing plasma treatment in an oxygen atmosphere, a nitrogen atmosphere, an $N_2O$ atmosphere, or the like.

Next, the insulating layer 703 to be a base is formed to cover the separation layer 702. The insulating layer 703 is formed as a single layer or a stack of a film that contains oxide of silicon or nitride of silicon by a sputtering method, a plasma CVD method, or the like. Oxide of silicon is a material that contains silicon (Si) and oxygen (O) such as silicon oxide, silicon oxynitride, or silicon nitride oxide. Nitride of silicon is a material that contains silicon (Si) and nitrogen (N) such as silicon nitride, silicon oxynitride, or silicon nitride oxide. In the case where the insulating layer to be the base has a two-layer structure, a silicon nitride oxide film may be formed as a first layer, and a silicon oxynitride film may be formed as a second layer, for example. In the case where the insulating layer to be a base has a three-layer structure, a silicon oxide film, a silicon nitride oxide film, and a silicon oxynitride film may be formed as a first insulating layer, a second insulating layer, and a third insulating layer respectively. Alternatively, a silicon oxynitride film, a silicon nitride oxide film, and a silicon oxynitride film may be formed as a first insulating layer, a second insulating layer, and a third insulating layer respectively. The insulating layer to be the base functions as a blocking layer for preventing impurities entering from the substrate 701.

Subsequently, an amorphous semiconductor layer 704 (for example, a film that contains amorphous silicon) is formed over the insulating layer 703.

Figure 10B:
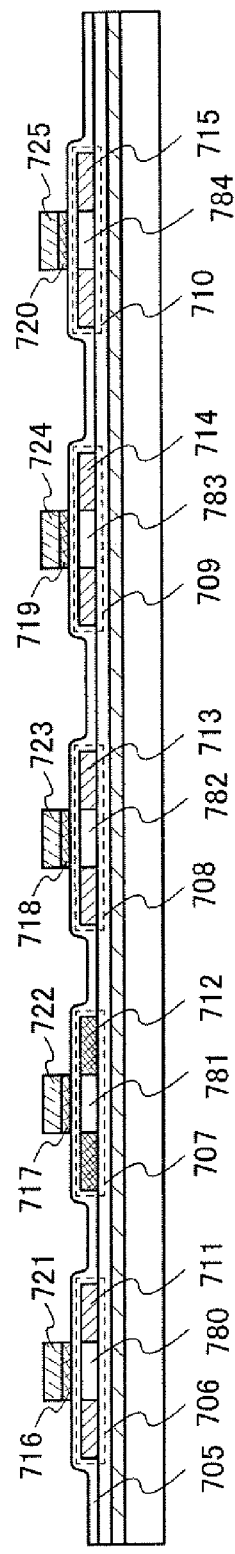

Then, a crystalline semiconductor layer obtained by crystallizing the amorphous semiconductor layer 704 by using a method similar to that in Embodiment Mode 1 is etched into a desired shape, whereby crystalline semiconductor layers 706 to 710 (also referred to as first semiconductor layers) are formed (FIG. 10B).

Then, a gate insulating layer 705 is formed to cover the crystalline semiconductor layers 706 to 710. The gate insulating layer 705 is formed as a single layer or a stack of a film that contains oxide of silicon or nitride of silicon by a plasma CVD method or a sputtering method. Specifically, a film that contains silicon oxide, a film that contains silicon oxynitride, or a film that contains silicon nitride oxide is formed as a single layer or a stack.

Subsequently, a first conductive layer and a second conductive layer are stacked on the gate insulating layer 705. The first conductive layer is formed at a thickness of 20 nm to 100 nm by a plasma CVD method or a sputtering method. The second conductive layer is formed at a thickness of 100 nm to 400 nm. The first conductive layer and the second conductive layer are formed by using an element such as tantalum (Ta), tungsten (W), titanium (Ti), molybdenum (Mo), aluminum (Al), copper (Cu), chromium (Cr), niobium (Nb), or the like or an alloy or a compound that contains the above-described element as its main component. Alternatively, a semiconductor material, typically, polycrystalline silicon doped with an impurity element such as phosphorus, may be used. As an example of a combination of the first conductive layer and the second conductive layer, a tantalum nitride layer and a tungsten layer, a tungsten nitride layer and a tungsten layer, a molybdenum nitride layer and a molybdenum layer, or the like can be used. Since tungsten and tantalum nitride have high heat resistance, heat treatment for thermal activation of an impurity element can be performed after the first conductive layer and the second conductive layer are formed of the given material. Alternatively, in the case where a three-layer structure is employed instead of a two-layer structure, a stacked-layer structure of a molybdenum layer, an aluminum layer, and a molybdenum layer may be employed.

Then, a resist mask is formed by a photolithography method and etching treatment for forming a gate electrode and a gate line is performed, whereby conductive layers 716 to 725 (also referred to as gate electrode layers) functioning as gate electrodes are formed.

Next, another resist mask is formed by a photolithography method. Then, an impurity element imparting n-type conductivity is added into the crystalline semiconductor layers 706, and 708 to 710 at low concentration by an ion doping method or an ion implantation method to form n-type impurity regions 711, and 713 to 715 and channel formation regions 780, and 782 to 784. An element belonging to group 15 of the Periodic Table may be used for the impurity element imparting n-type conductivity. For example, phosphorus (P) or arsenic (As) is used.

Next, another resist mask is formed by a photolithography method. Then, an impurity element imparting p-type conductivity is added into the crystalline semiconductor layer 707 to form a p-type impurity region 712 and a channel formation region 781. For example, boron (B) is used for the impurity element imparting p-type conductivity.

Figure 10C:
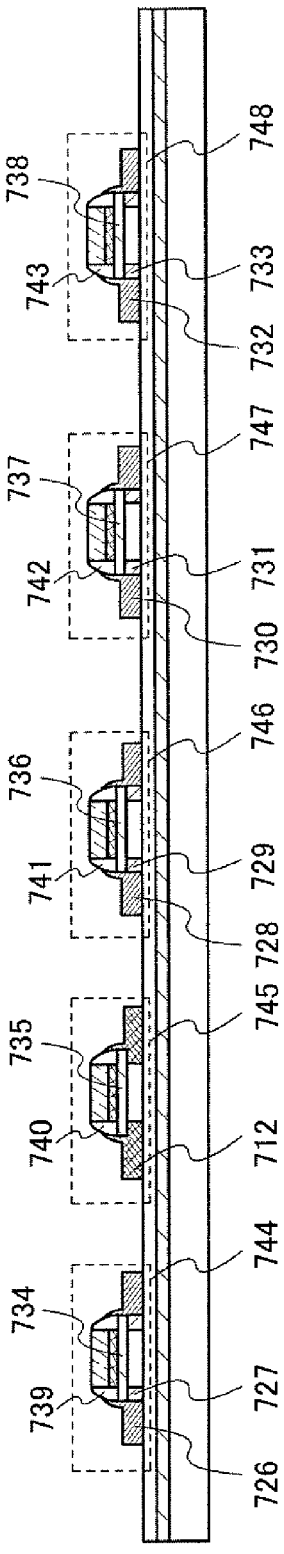

Next, an insulating layer is formed so as to cover the gate insulating layer 705 and the conductive layers 716 to 725. The insulating layer is formed as a single layer or a stack of a film that contains an inorganic material such as silicon, oxide of silicon, or nitride of silicon or a film that contains an organic material such as an organic resin by a plasma CVD method or a sputtering method. Then, the insulating layer is etched as selected by anisotropic etching mainly in the perpendicular direction with respect to the surface of the substrate, whereby insulating layers 739 to 743 (also referred to as sidewalls) in contact with the side surfaces of the conductive layers 716 to 725 are formed (FIG. 10C). Concurrently with the formation of the insulating layers 739 to 743, insulating layers 734 to 738 are formed by etching the gate insulating layer 705.

Then, using the resist mask using a photolithography method and the insulating layers 739 to 743 as masks, an impurity element imparting n-type conductivity is added into the crystalline semiconductor layers 706, and 708 to 710 so that first n-type impurity regions 727, 729, 731, and 733 (also referred to as LDD regions) and second n-type impurity regions 726, 728, 730, and 732 (also referred to as source and drain regions) are formed. The concentration of the impurity element in the first n-type impurity regions 727, 729, 731, and 733 is lower than the concentration of the impurity element in the second n-type impurity regions 726, 728, 730, and 732.

Next, second semiconductor layers are formed over the crystalline semiconductor layers 706 to 710. Then, heat treatment is performed by using a method similar to that in Embodiment Mode 1, so that semiconductor layers each having a source or drain region 726, 728, 730, 732, or 712 of which thickness is larger than that of a channel formation region can be formed. Through the above steps, n-type thin film transistors 744, 746 to 748 and a p-type thin film transistor 745 are completed.

Figure 11A:
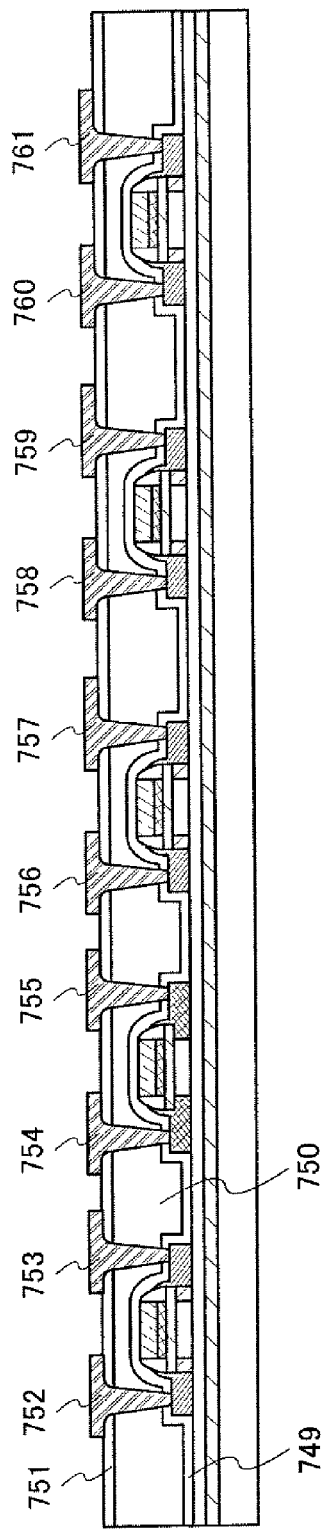
FIGS. 11A and 11B are cross-sectional views for describing a manufacturing process of a semiconductor device of the present invention.

Then, an insulating layer is formed as a single layer or a stack so as to cover the thin film transistors 744 to 748 (FIG. 11A). The insulating layer covering the thin film transistors 744 to 748 is formed as a single layer or a stack using an inorganic material such as oxide of silicon or nitride of silicon, an organic material such as polyimide, polyimide, benzocyclobutene-based polymer, acrylic polymer, epoxy-based polymer, and siloxane polymer, or the like by an SOG method, a droplet discharge method, or the like. For example, in the case where the insulating layer covering the thin film transistors 744 to 748 has a three-layer structure, a film that contains silicon oxide may be formed as a first insulating layer 749, preferably, a film that contains a resin may be formed as the second insulating layer 750, and a film that contains silicon nitride may be formed as the third insulating layer 751.

Note that before the insulating layers 749 to 751 are formed or after one or more of thin layers of the insulating layers 749 to 751 are formed, heat treatment for recovering the crystallinity of the semiconductor layer, for activating the impurity element which has been added into the semiconductor layer, or for hydrogenating the semiconductor layer is preferably performed. For the heat treatment, a thermal annealing method, a laser annealing method, an RTA method, or the like is preferably used.

Then, the insulating layers 749 to 751 are etched by using a photolithography method to form contact holes so that the second n-type impurity regions 726, 728, 730 and 732 and the p-type impurity region 712 are exposed. Subsequently, a conductive layer is formed so as to fill the contact holes and patterned to form the conductive layers 752 to 761 each functioning as a source electrode or a drain electrode.

The conductive layers 752 to 761 are formed as a single layer or a stack using an element such as titanium (Ti), aluminum (Al), or neodymium (Nd); an alloy or a compound that contains the above-described element as its main component by a plasma CVD method or a sputtering method. An alloy that contains aluminum as its main component is an alloy that contains nickel whose main component is aluminum or an alloy that contains nickel and one or both of carbon and silicon whose main component is aluminum, for example. Each of the conductive layers 752 to 761 preferably uses, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin layer formed using titanium, nitride of titanium, molybdenum, or nitride of molybdenum. Aluminum and aluminum silicon have low resistance and are inexpensive, and are therefore suitable for forming the conductive layers 752 to 761. In addition, generation of a hillock of aluminum or aluminum silicon can be prevented when barrier layers are provided as upper and lower layers of a stacked-layer structure. Further, the use of barrier layer containing titanium allows sufficient contact between the crystalline semiconductor layers and the conductive layers even if a thin film is formed by the natural oxidation of the crystalline semiconductor layer. This is because highly reducible titanium readily reduces the naturally formed oxide film.

Figure 11B:
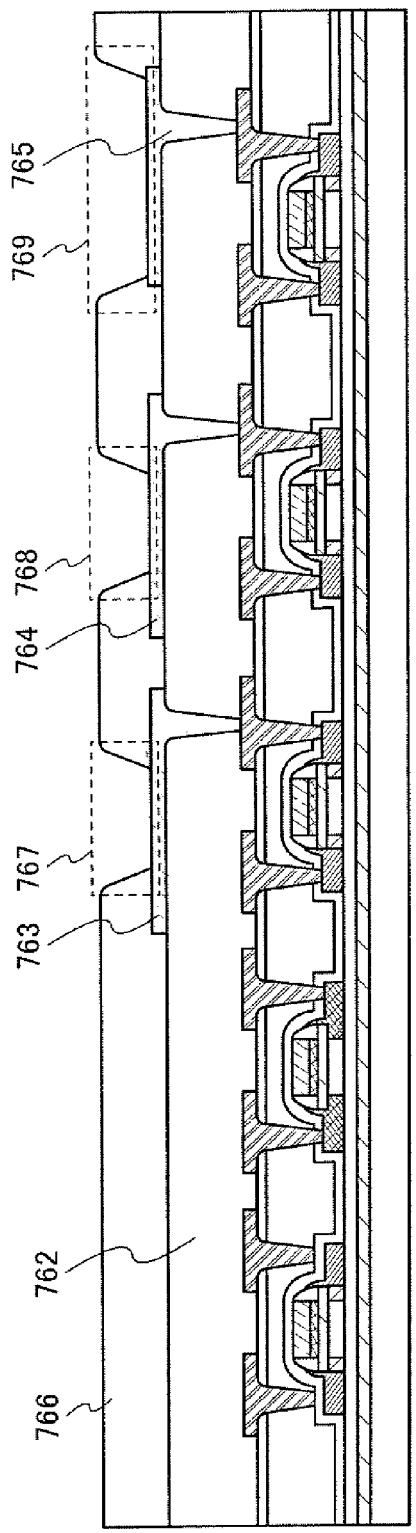

Next, the insulating layer 762 is formed so as to cover the conductive layers 752 to 761 (FIG. 11B). The insulating layer 762 is formed as a single layer or a stack using an inorganic material or an organic material by an SOG method, a droplet discharge method, or the like. The insulating layer 762 is preferably formed at a thickness of 0.75 μm to 3 μm.

Subsequently, the insulating layer 762 is etched by using a photolithography method to form contact holes in which the conductive layers 757, 759, and 761 are exposed. Then, a conductive layer is formed so as to fill the contact holes. The conductive layer is formed by a plasma CVD method or a sputtering method using a conductive material. Next, the conductive layer is patterned to form the conductive layers 763 to 765. Note that each of the conductive layers 763 and 764 corresponds to one of a pair of conductive layers included in a memory element. Therefore, the conductive layers 763 to 765 are preferably formed as a single layer or a stack using titanium, an alloy or a compound that contains titanium as its main component. Titanium has low resistance and enables size reduction of the memory element, whereby high integration can be realized. In addition, in an etching process for forming the conductive layers 763 to 765, it is preferable to perform wet etching in order to prevent damage to the thin film transistors 744 to 748 that exist in lower layers; hydrofluoric acid (HF) or an aqueous solution of ammonia and hydrogen peroxide is preferably used as the etchant.

Then, the insulating layer 766 is fainted so as to cover the conductive layers 763 to 765. The insulating layer 766 is formed as a single layer or a stack using an inorganic material or an organic material by an SOG method, a droplet discharge method, or the like. In addition, the insulating layer 766 is preferably formed at a thickness of 0.75 μm to 3 μm. The insulating layer 766 is then etched by using a photolithography method to form contact holes 767 to 769 in which the conductive layers 763 to 765 are respectively exposed.

Figure 12A:
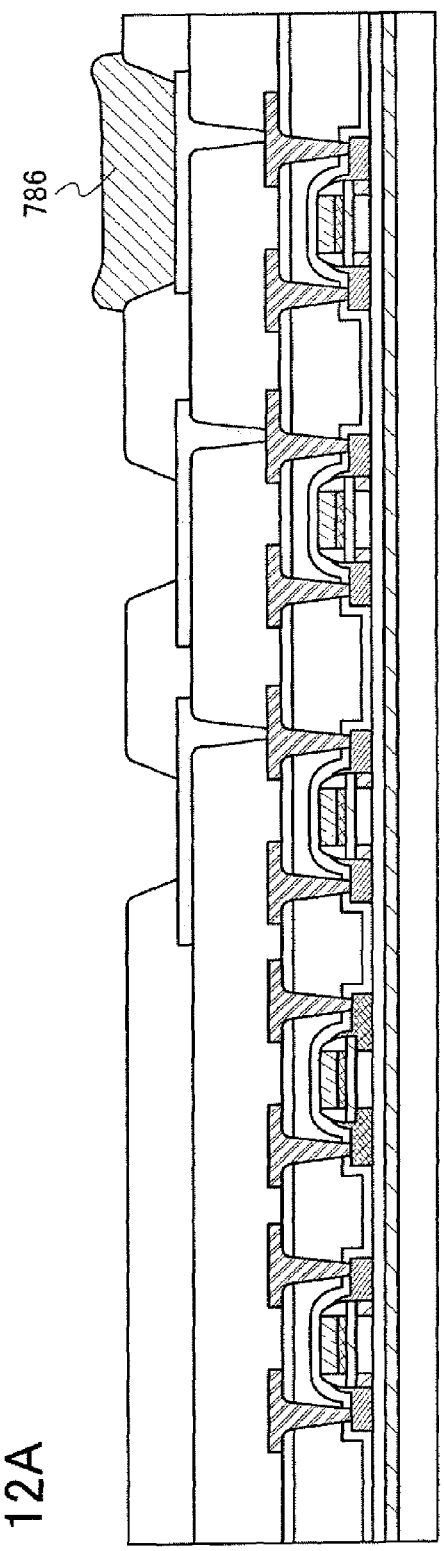
FIGS. 12A and 12B are cross-sectional views for describing a manufacturing process of a semiconductor device of the present invention.

Subsequently, the conductive layer 786 that functions as an antenna is formed so as to be in contact with the conductive layer 765 (FIG. 12A). The conductive layer 786 is formed by a plasma CVD method, a sputtering method, a printing method, a droplet discharge method, or the like using a conductive material. Preferably, the conductive layer 786 is formed as a single layer or a stack using an element such as aluminum (Al), titanium (Ti), silver (Ag), or copper (Cu) or an alloy or a compound that contains the above-described element as its main component. Specifically, the conductive layer 786 is formed in such a way that a film is formed by a screen printing method using a paste that contains silver, and heat treatment is performed thereafter at 50° C. to 350° C. Alternatively, an aluminum layer is formed by a sputtering method and patterned to form the conductive layer 786. The patterning of the aluminum layer is preferably performed by wet etching, and heat treatment at 200° C. to 300° C. is preferably conducted after the wet etching.

Figure 12B:
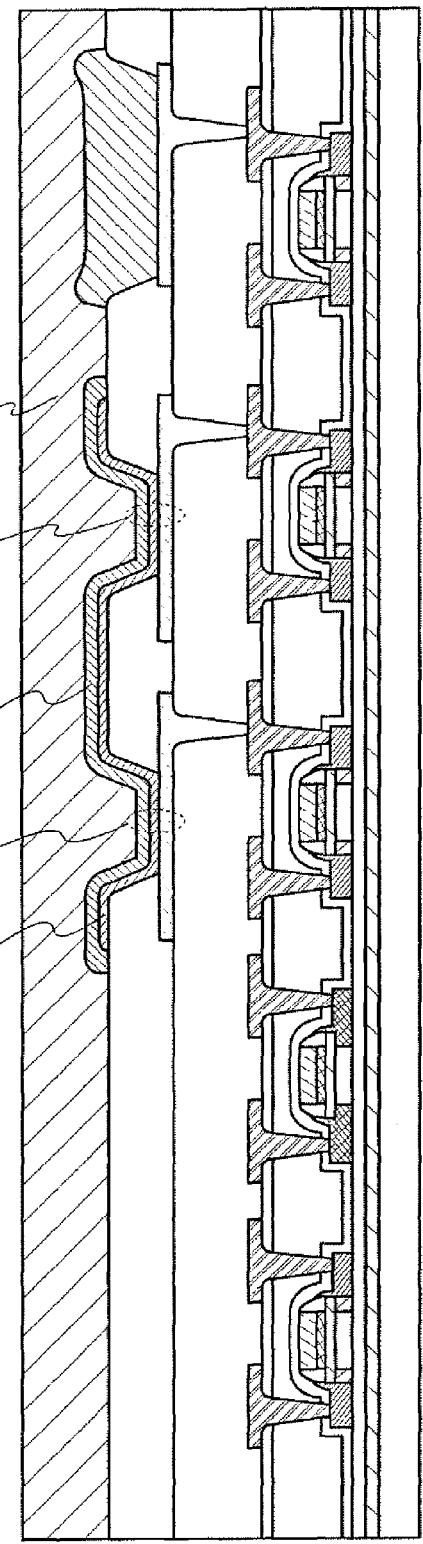

Next, an organic compound layer 787 is formed so as to be in contact with the conductive layers 763 and 764 (FIG. 12B). The organic compound layer 787 is formed by an evaporation method, a droplet discharge method, a spin coating method, a screen printing method, or the like. Subsequently, the conductive layer 771 is formed in contact with the organic compound layer 787. The conductive layer 771 is formed by a sputtering method, an evaporation method, or the like.

Through the above-described steps, the memory element 789 which includes the conductive layer 763, the organic compound layer 787, and the conductive layer 771, and the memory element 790 which includes the conductive layer 764, the organic compound layer 787, and the conductive layer 771 are fabricated.

Note that according to the manufacturing steps described above, the step for forming the organic compound layer 787 is carried out after the step for forming the conductive layer 786 that functions as an antenna because the heat resistance of the organic compound layer 787 is not high.

Subsequently, the insulating layer 772 functioning as a protective layer is formed by an SOG method, a droplet discharge method, or the like so as to cover the memory elements 789 and 790 and the conductive layer 786 that functions as an antenna. The insulating layer 772 is formed using a film that contains carbon such as DLC (diamond-like carbon), a film that contains silicon nitride, a film that contains silicon nitride oxide, a film formed of an organic material, or, preferably, a film formed of an epoxy resin.

Figure 13A:
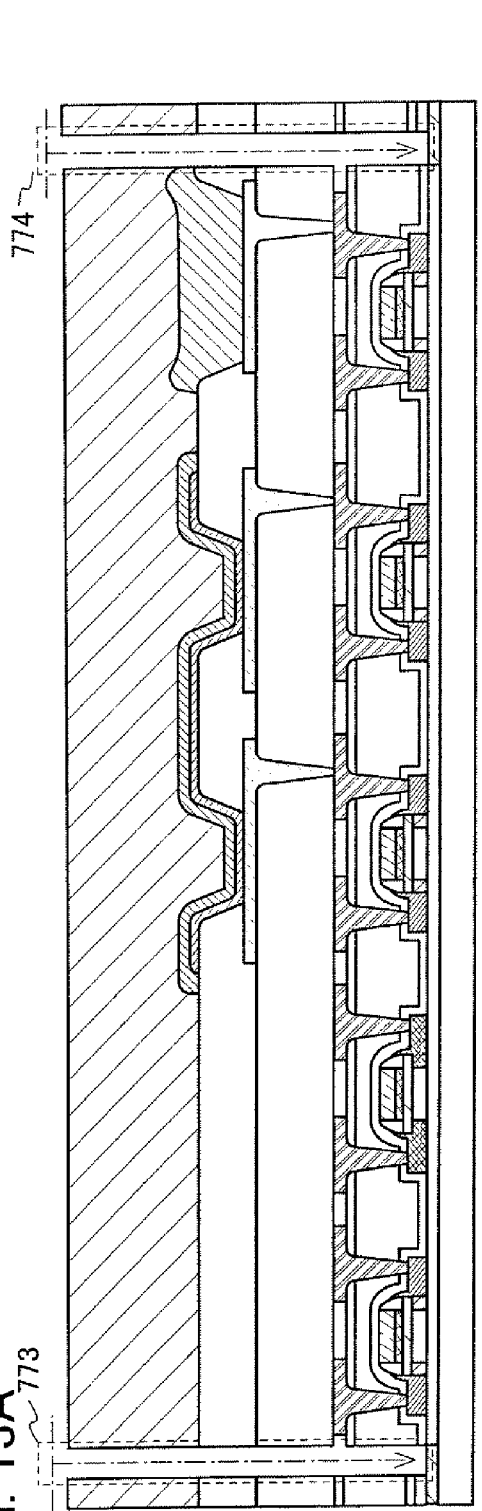
FIGS. 13A and 13B are cross-sectional views for describing a manufacturing process of a semiconductor device of the present invention.
Figure 13B:
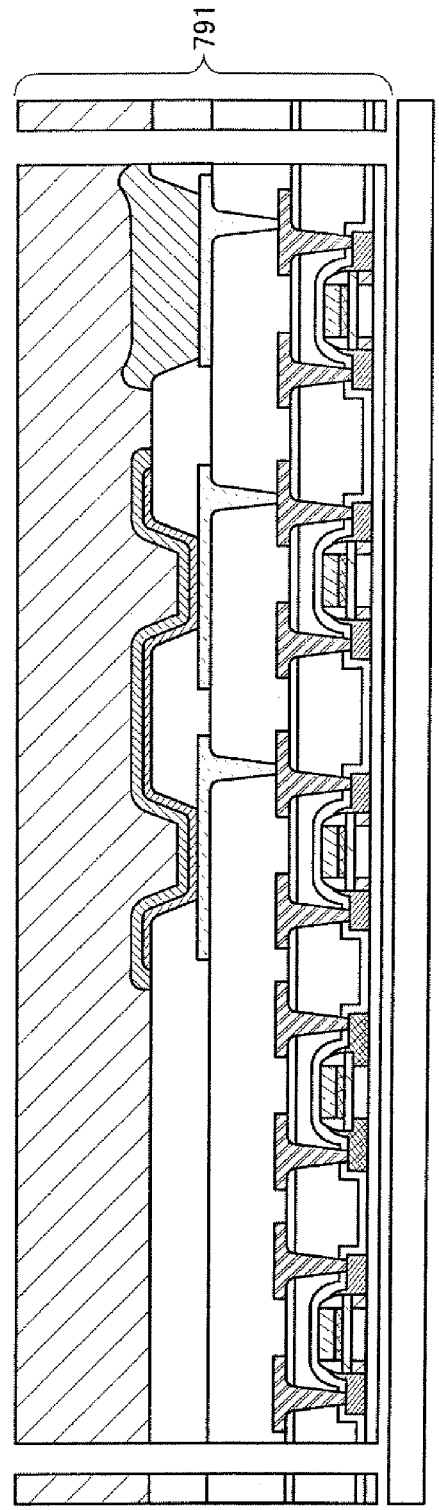

Next, a thin film integrated circuit 791 is separated from the substrate 701. Here, after openings 773 and 774 are formed by irradiation with laser beams (for example, a laser beam having a wavelength in a UV region) (FIG. 13A), the thin film integrated circuit 791 can be separated from the substrate 701 using physical force. Alternatively, after the openings 773 and 774 are formed, an etchant may be introduced into the openings 773 and 774 to remove the separation layer 702 before separating the thin film integrated circuit 791 from the substrate 701 (FIG. 13B). As the etchant, a gas or a liquid containing halogen fluoride or a halogen compound is used; for example, chlorine trifluoride ($ClF_3$) is used as a gas that contains halogen fluoride. When the separation layer 702 is removed using this etching process, the thin film integrated circuit 791 is separated from the substrate 701. Part of the separation layer 702 may be left remaining without being entirely removed, which allows the reduction of the consumption of the etchant and the processing time required for removing the separation layer. Further, the thin film integrated circuit 791 can be retained over the substrate 701 even after the removal process of the separation layer 702 if a part of the separation layer 702 is left.

It is preferable to reuse the substrate 701 after the thin film integrated circuit 791 is separated in order to reduce manufacturing costs. In addition, the insulating layer 772 is formed to prevent the thin film integrated circuit 791 from shattering after the separation layer 702 is removed. The thin film integrated circuit 791 which is small, thin, and light easily shatters after the separation layer 702 is removed since it is not attached firmly to the substrate 701. However, the formation of the insulating layer 772 on the thin film integrated circuit 791 can added the weight of the insulating layer 772 to the thin film integrated circuit 791, and hence, release from the substrate 701 can be prevented. In addition, the formation of the insulating layer 772 secures the strength of the thin, and light thin film integrated circuit 791, which allows prevention of rolling of the thin film integrated circuit 791 after separation from the substrate 701.

Subsequently, one surface of the thin film integrated circuit 791 is attached to the second base 776, and the thin film integrated circuit 791 is completely separated from the substrate 701. Then, the first base 775 is provided on the other surface of the thin film integrated circuit 791, and one or both of heat treatment and pressure treatment are performed to seal the thin film integrated circuit 791 with the first base 775 and the second base 776. Accordingly, the semiconductor device shown in FIG. 9B can be fabricated. The first base 775 and the second base 776 may each be a film formed of polypropylene, polyester, polyvinylfluoride, polyvinylchloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like. The film is bonded to a subject (i.e., the thin film integrated circuit 791) by thermocompression bonding. In the case where both the heat treatment and pressure treatment are carried out, an adhesive layer which is provided on the outermost surface of the film or a layer (not an adhesive layer) which is provided on the outermost layer of the film is melted by heart treatment and then is pressurized so that the film is attached to the subject. An adhesive layer may be provided on a surface of the first base 775 or the second base 776 but not necessarily be provided. As the adhesive layer, a film that contains an adhesive such as a heat curable resin, an ultraviolet-curable resin, an epoxy resin-based adhesive, or a resin additive can be used.

Through the above steps, a semiconductor device which has a memory element and an antenna and which can input and output data without contact can be manufactured.

A semiconductor layer used for a semiconductor device of this embodiment mode is formed so that a thickness of a source region or a drain region is larger than that of a channel formation region. This feature is advantageous in restoring the crystallinity in heat treatment for thermal activation of an impurity element which is performed after addition of the impurity element by an ion doping method, or the like, and an increase in resistance of the source region or the drain region can be suppressed. The subthreshold swing (S value) can be decreased, and reduction in on-current can be suppressed because the thickness of the channel formation region is smaller than the thickness of the source region or the drain region. Further, since the semiconductor layer having a concavo-convex shape is formed by stacking semiconductor layers, the thickness can be easily controlled. Accordingly, a highly responsive semiconductor device in which the subthreshold swing (S value) is small and reduction in on-current is suppressed can be manufactured easily.

Embodiment Mode 5

In this embodiment mode, an example of a block diagram of a semiconductor device which is capable of inputting and outputting data without contact will be described. According to its usage mode, a semiconductor device capable of inputting and outputting data without contact may also be referred to as an RFID tag, an ID tag, an IC tag, an IC chip, an RF tag, a wireless tag, an electronic tag, or a wireless chip.

Figure 14:
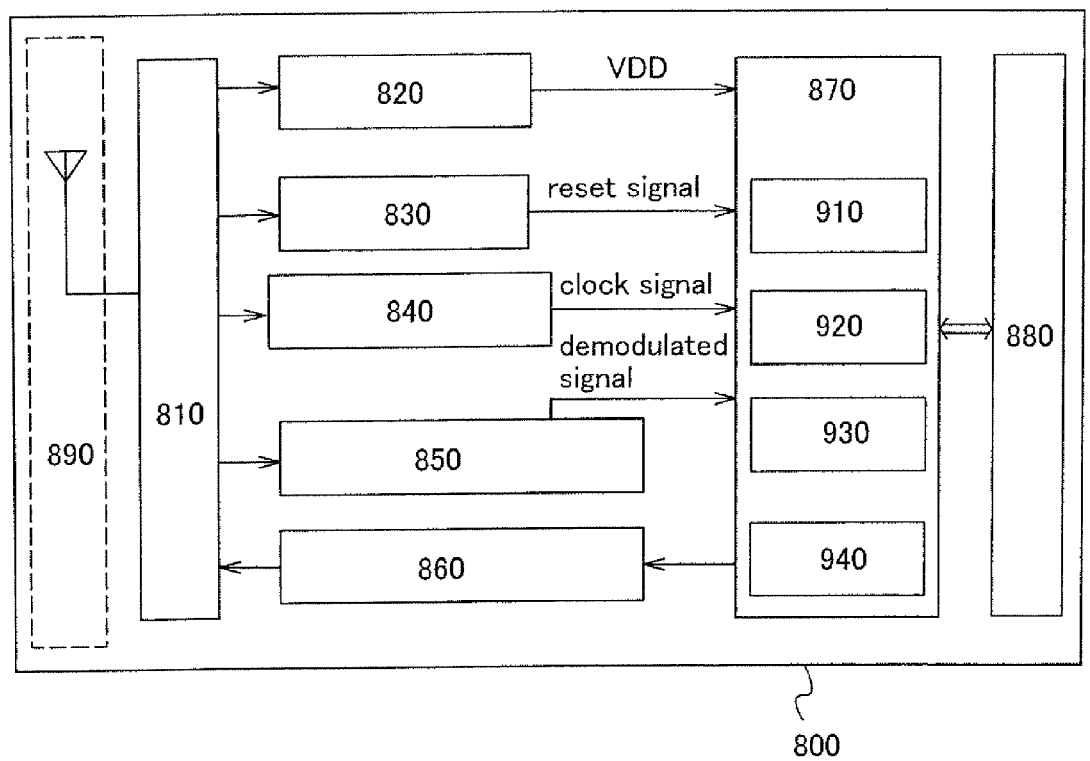
FIG. 14 is a block diagram for describing a structure of a semiconductor device of the present invention.

FIG. 14 shows a block diagram for describing a structure of a semiconductor device which is capable of inputting and outputting data without contact. A semiconductor device 800 which is capable of inputting and outputting data without contact has a function of communicating data with a reader/writer without contact and includes a high-frequency circuit 810, a power supply circuit 820, a reset circuit 830, a clock generation circuit 840, a data demodulation circuit 850, a data modulation circuit 860, a control circuit 870 which controls other circuits, a memory circuit 880, and an antenna 890. Note that the memory circuit 880 shown in FIG. 14 corresponds to the memory portion 202 shown in FIG. 9A. The high-frequency circuit 810, the power supply circuit 820, the reset circuit 830, the clock generation circuit 840, the data demodulation circuit 850, the data modulation circuit 860, and the control circuit 870 shown in FIG. 14 correspond to the integrated circuit portion 201 shown in FIG. 9A. The antenna 890 shown in FIG. 14 corresponds to the antenna 303 shown in FIG. 9A.

The high-frequency circuit 810 is a circuit which receives a signal from the antenna 890, and outputs a signal, which is received from the data modulation circuit 860, from the antenna 890. The power supply circuit 820 is a circuit which generates a power supply potential from a receive signal. The reset circuit 830 is a circuit which generates a reset signal from a receive signal. The clock generation circuit 840 is a circuit which generates various clock signals based on a receive signal input from the antenna 890. The data demodulation circuit 850 is a circuit which demodulates a receive signal and outputs the demodulated signal to the control circuit 870. The data modulation circuit 860 is a circuit which modulates a signal received from the control circuit 870. Further, as the control circuit 870, a code extraction circuit 910, a code determination circuit 920, a CRC determination circuit 930, and an output unit circuit 940 are provided, for example. The code extraction circuit 910 is a circuit which extracts each of a plurality of codes included in an instruction transmitted to the control circuit 870. The code determination circuit 920 is a circuit which determines the content of an instruction by comparing an extracted code with a code which corresponds to a reference. The CRC determination circuit 930 is a circuit which detects the presence of transmission errors and the like based on a determined code.

Next, an example of an operation of the above-mentioned semiconductor device will be described. First, a radio signal is received by the antenna 890. The radio signal is transmitted to the power supply circuit 820 via the high-frequency circuit 810, and a high power supply potential (hereinafter referred to as VDD) is generated. The VDD is supplied to circuits included in the semiconductor device 800. A signal transmitted to the data demodulation circuit 850 via the high-frequency circuit 810 is demodulated (hereinafter, this signal is referred to as a demodulated signal). Further, signals passed through the reset circuit 830 and the clock generation circuit 840 via the high-frequency circuit 810, and the demodulated signal are transmitted to the control circuit 870. The signals transmitted to the control circuit 870 are analyzed by the code extraction circuit 910, the code determination circuit 920, the CRC determination circuit 930, and the like. Then, based on the analyzed signals, information in the semiconductor device stored in the memory circuit 880 is output. The output information of the semiconductor device passes through the output unit circuit 940 and is encoded. Further, the encoded information of the semiconductor device 800 passes through the data modulation circuit 860 and is superposed on a radio signal and transmitted by the antenna 890. Note that a low power supply potential (hereinafter referred to as VSS) is common in the plurality of circuits included in the semiconductor device 800, and GND can be used as VSS. Further, the high-frequency circuit 810, the power supply circuit 820, the reset circuit 830, the clock generation circuit 840, the data demodulation circuit 850, the data modulation circuit 860, the control circuit 870 for controlling other circuits, the memory circuit 880, and the like can be formed using an above-described semiconductor element; representatively, the thin film transistor.

When a signal is transmitted from a reader/writer to the semiconductor device 800 and a signal transmitted from the semiconductor device 800 is received by the reader/writer in this manner, data in the semiconductor device can be read.

Further, the semiconductor device 800 may be one in which a power source (e.g., a battery) is not included and a power supply voltage is supplied to circuits by using electromagnetic waves. The semiconductor device 800 may also be one in which a power source (e.g., a battery) is included, and a power supply voltage is supplied to circuits by using both electromagnetic waves and the power source (battery).

Figure 15A:
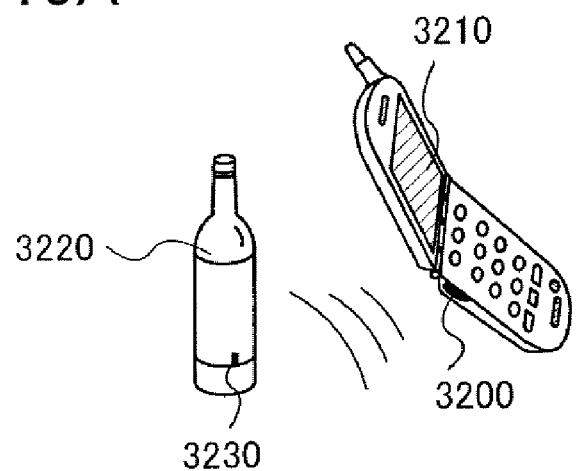
FIGS. 15A and 15B are diagrams for describing usage modes of a semiconductor device of the present invention.
Figure 15B:
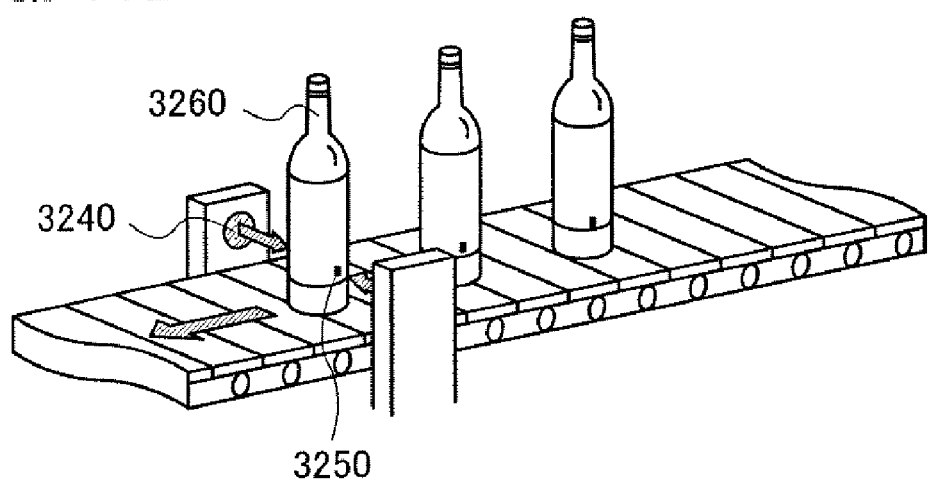

Next, an example of a usage mode of a semiconductor device capable of inputting and outputting data without contact will be described with reference to FIGS. 15A and 15B. A side surface of a mobile terminal which includes a display portion 3210 is provided with a reader/writer 3200. A side surface of a product 3220 is provided with a semiconductor device 3230 (FIG. 15A). When the reader/writer 3200 is held up to the semiconductor device 3230 included in the product 3220, the display portion 3210 displays information about the product such as its materials, its place of production, inspection results for each production step, a history of the distribution process, and a description of the product. Further, when a product 3260 is conveyed by a conveyer belt, the product 3260 can be inspected by using a reader/writer 3240 and a semiconductor device 3250 with which the product 3260 is provided (FIG. 15B). When the semiconductor device is used in a system in this manner, information can be obtained easily, and higher performance and higher added value can be provided to a variety of products.

A semiconductor device of this embodiment mode can be used by being provided in, for example, paper money, coins, securities, certificates, bearer bonds, packing containers, books, recording media, personal belongings, vehicles, food items, clothes, healthcare items, articles for daily life, medicals, electronic devices, and the like. For these examples, modes of use of the semiconductor device of the present invention will be described with reference to FIGS. 16A to 16E and FIGS. 17A to 17D.

Figure 16A:
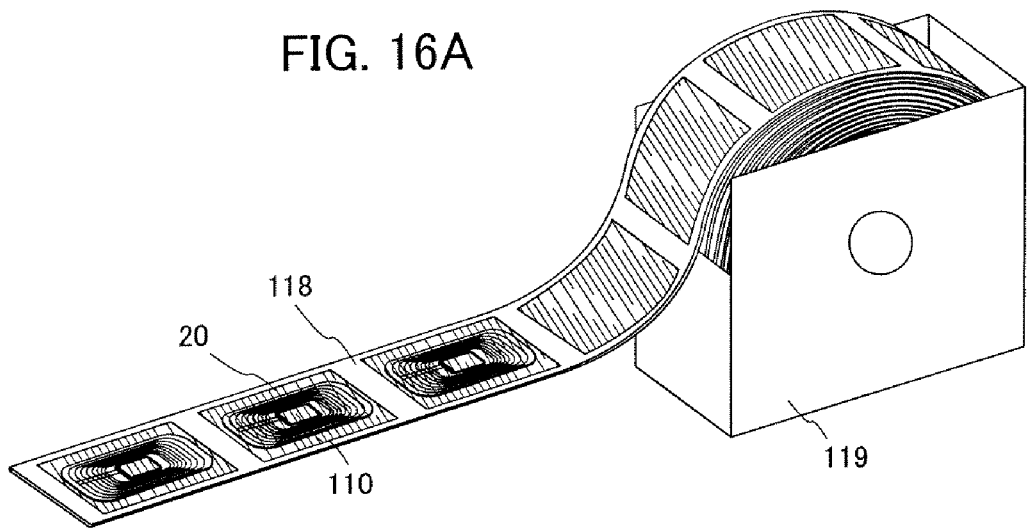
FIGS. 16A to 16E are diagrams for describing usage modes of a semiconductor device of the present invention.

FIG. 16A shows an example of a state of completed products of ID labels of the present invention. On a label board (separate paper) 118, a plurality of ID labels (ID sticker) 20 with built-in IC chips 110 are formed. The ID labels 20 are put in a box 119. On the ID label 20, information on a commercial product or service (for example, a name of the product, a brand, a trademark, a trademark owner, a seller, a manufacturer, and the like) is written, while an ID number that is unique to the commercial product (or the kind of the commercial product) is assigned to the built-in IC chip 110 to make it possible to easily figure out forgery, infringement of intellectual property rights such as a patent and a trademark, and illegality such as unfair competition. In addition, a lot of information that is too much to be written clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product, and the like can be input in the IC chip 110 so that a transactor and a consumer can access the information using a simple reader. While rewriting, deleting, and the like of the information can be easily conducted by the producer, a transactor or consumer is not allowed to conduct rewriting, deleting, and the like of the information.

Figure 16B:
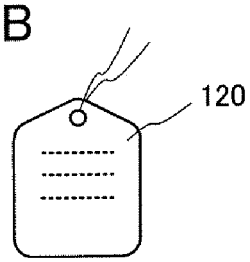

FIG. 16B shows an ID tag 120 with a built-in IC chip of the present invention. By mounting the ID tag on commercial products, the management of the commercial products becomes easier. For example, in the case where the commercial product is stolen, the thief can be figured out quickly by tracing the pathway of the commercial product. In this way, by providing the ID tag, commercial products that are excellent in so-called traceability (traceability means that preparation is made for smoothly grasping the cause of a problem, which may occur at each complicated stage of manufacture and distribution, by tracing the pathway) can be distributed.

Figure 16C:
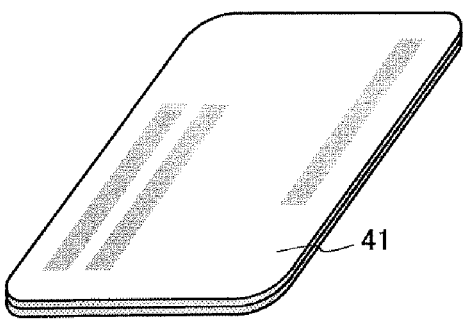

FIG. 16C shows an example of a state of a completed product of an ID card 41 of the present invention. The ID card includes all kinds of cards such as a cash card, a credit card, a prepaid card, an electronic ticket, electronic money, a telephone card, and a membership card.

Figure 16D:
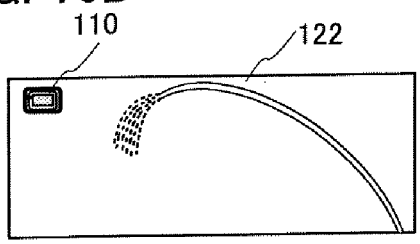

FIG. 16D shows an example of a state of a completed product of a bearer bond 122 with the built-in IC chip 110 of the present invention. The bearer bonds include, but not limited to of course, stamps, tickets, admission tickets, merchandise coupons, book coupons, stationery coupons, beer coupons, rice coupons, various gift coupons, and various service coupons. In addition, an IC chip can be provided in securities such as a check, a bill, and a promissory note, certificates such as a driver's license and a resident card, or the like, not limited to the bearer bonds.

Figure 16E:
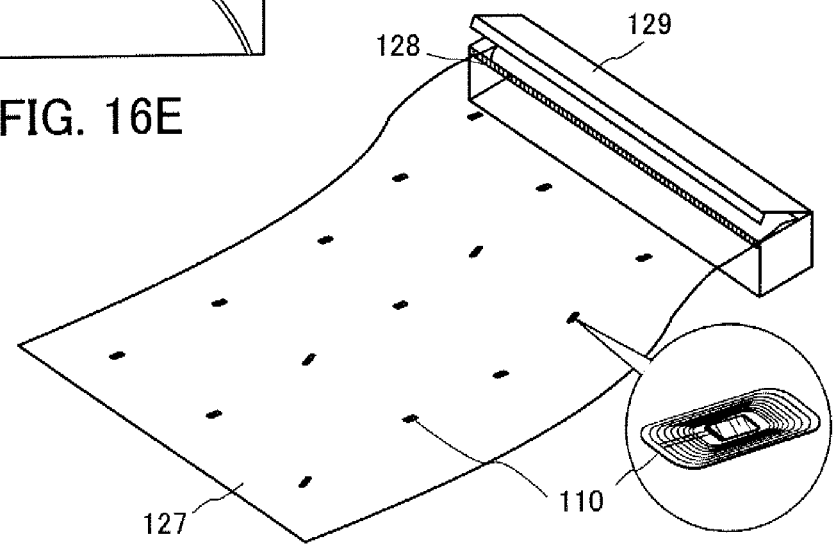

FIG. 16E shows a wrapping film 127 with the built-in IC chips 110, for wrapping a commercial product. The wrapping film 127 can be manufactured, for example, by scattering IC chips arbitrarily on a lower film and covering them with an upper film. The wrapping film 127 is put in a box 129, and the desired amount of the film can be cut away with a cutter 128 and used. The material of the wrapping film 127 is not particularly limited. For example, materials such as a thin film resin, an aluminum foil, and paper can be used.

Figure 17A:
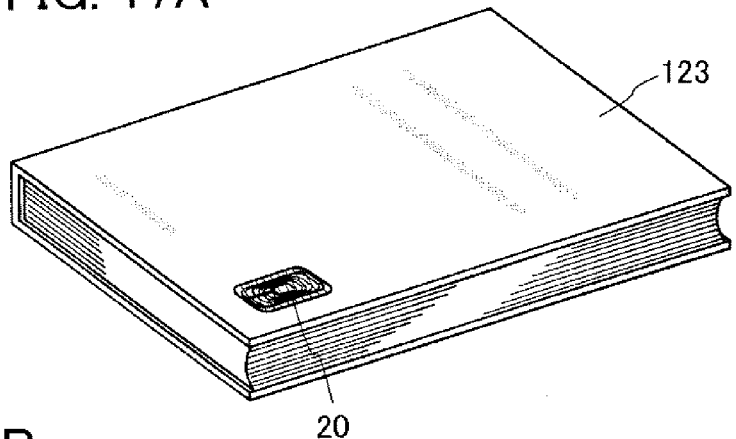
FIGS. 17A to 17D are diagrams for describing usage modes of a semiconductor device of the present invention.
Figure 17B:
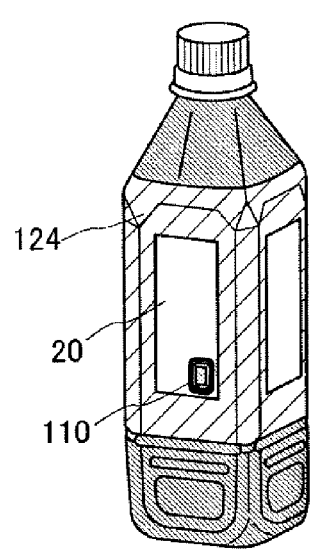

FIG. 17A shows a book 123 to which the ID label 20 of the present invention is attached, and FIG. 17B shows a plastic bottle 124 to which the ID label 20 with the built-in IC chip 110 of the present invention is attached. Note that the goods provided with ID labels are not limited to these. The ID label may be attached to various goods such as packing containers such as paper for packing a box lunch; recording media such as DVD software and video tapes; vehicles including wheeled vehicles such as bicycles and ships; personal belongings such as bags and glasses; food items such as foods and beverages; apparel such as clothing and footwear; healthcare items such as medical devices and health appliances; articles for daily life such as furniture and lighting systems; medical products such as medicines and agricultural chemicals; and electronic devices such as liquid crystal display devices, EL display devices, television sets (television receivers, flat-screen television receivers), and cellular phones. The ID label 20 that is used in the present invention is quite thin; therefore, when the ID label 20 is mounted on an article such as the book, the function or design of the article is not adversely affected. Furthermore, in the case where the IC chip 110 of the present invention can input and output data without contact, an antenna can be formed in an integrated manner as part of a thin film integrated circuit to make it easier to transfer the thin film integrated circuit directly to a commercial product with a curved surface.

Figure 17C:
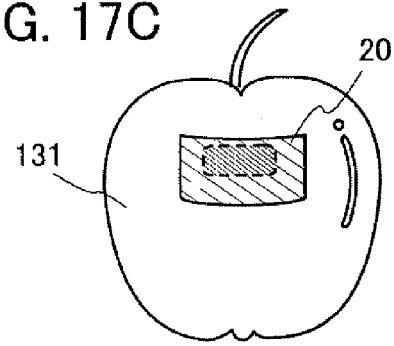
Figure 17D:
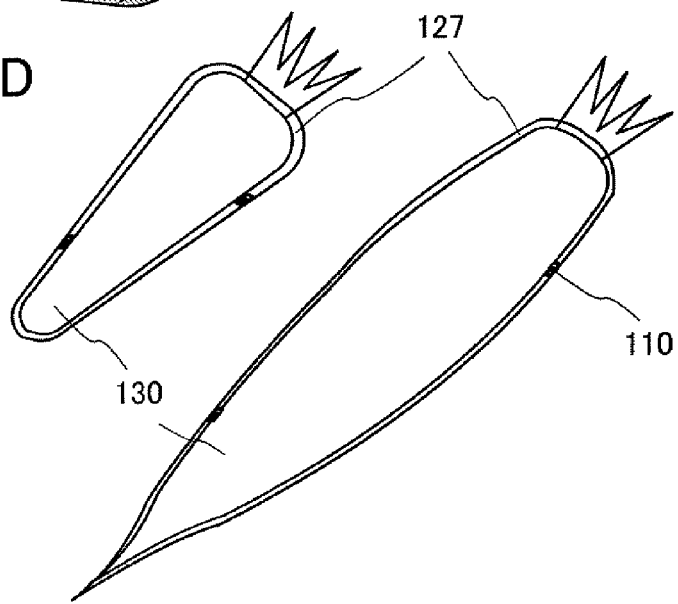

FIG. 17C shows a state in which the ID label 20 is directly attached to fresh food such as a fruit 131. In addition, FIG. 17D shows an example in which fresh food such as a vegetable 130 is wrapped in the wrapping film 127 that has the built-in IC chip 110. When an ID label is attached to a commercial product, the label may be peeled off. However, when the commercial product is wrapped in wrapping films, it is difficult to peel off the wrapping film, which brings some merit in regard to security.

When an RFID tag is provided for paper money, coins, securities, certificates, bearer bonds, and the like, forgery of those can be prevented. When an RFID tag is provided in packing containers, books, recording media, personal belongings, food items, clothes, articles for daily life, electronic devices, and the like, inspection systems, rental systems, and the like can be used more efficiently. When an RFID tag is provided in vehicles, healthcare items, medical products, and the like, forgery and theft thereof can be prevented and medical products can be prevented from being taken in the wrong manner. The RFID tag is attached to a surface of an object or incorporated in an object. For example, the RFID tag may be incorporated in the paper of a book or an organic resin of a package.

In this manner, when the RFID tag is equipped in containers for packages, books, recording media, personal belongings, foods, clothes, articles for daily life, electronic devices, and the like, inspection system, rental system, and the like can be performed more efficiently. The RFID tag also prevents vehicles, healthcare items, medical products, and the like from being forged or stolen. In addition, since the semiconductor device of the present invention is thin, when the RFID tag is implanted into creatures such as animals, each creature can be identified easily. For example, when the RFID tag is implanted in creatures such as domestic animals, the year of birth, sex, breed, and the like can be easily identified.

As described above, the semiconductor device of this embodiment mode can be used for any product.

This application is based on Japanese Patent Application serial No. 2007-158746 filed with Japan Patent Office on Jun. 15, 2007, the entire contents of which are hereby incorporated by reference.

What is claimed is:

1. A method for manufacturing a semiconductor device comprising the steps of:
    forming a first semiconductor layer having an island shape on an insulating surface;
    forming a gate electrode over a channel formation region of the first semiconductor layer with a gate insulating layer interposed therebetween;
    introducing an impurity element into a portion of the first semiconductor layer;
    forming a second semiconductor layer in direct contact with the portion of the first semiconductor layer and the insulating surface; and
    performing a heat treatment to the first semiconductor layer and the second semiconductor layer, thereby forming a third semiconductor layer in which a thickness of the channel formation region is smaller than a thickness of a source region.

2. The method for manufacturing the semiconductor device according to claim 1, wherein the heat treatment is performed by a thermal annealing method.

3. The method for manufacturing the semiconductor device according to claim 1, wherein the first semiconductor layer is a single-crystal silicon layer.

4. The method for manufacturing the semiconductor device according to claim 1, wherein the first semiconductor layer is a layer formed by crystallizing an amorphous semiconductor layer using a heat treatment.

5. The method for manufacturing the semiconductor device according to claim 1, wherein the second semiconductor layer comprises an amorphous semiconductor layer.

6. The method for manufacturing the semiconductor device according to claim 1, wherein epitaxial growth of the second semiconductor layer occurs in the heat treatment.

7. A method for manufacturing a semiconductor device comprising the steps of:
    forming a first semiconductor layer having an island shape on an insulating surface;
    forming a gate electrode over a channel formation region of the first semiconductor layer with a gate insulating layer interposed therebetween;
    introducing an impurity element into a portion of the first semiconductor layer;
    forming a second semiconductor layer in direct contact with the portion of the first semiconductor layer and the insulating surface; and
    performing a heat treatment to the first semiconductor layer and the second semiconductor layer so that crystal growth of the second semiconductor layer occurs, thereby forming a third semiconductor layer in which a thickness of the channel formation region is smaller than a thickness of a source region.

8. The method for manufacturing the semiconductor device according to claim 7, wherein the heat treatment is performed by a thermal annealing method.

9. The method for manufacturing the semiconductor device according to claim 7, wherein the first semiconductor layer is a single-crystal silicon layer.

10. The method for manufacturing the semiconductor device according to claim 7, wherein the first semiconductor layer is a layer formed by crystallizing an amorphous semiconductor layer using a heat treatment.

11. The method for manufacturing the semiconductor device according to claim 7, wherein the second semiconductor layer comprises an amorphous semiconductor layer.

12. A method for manufacturing a semiconductor device comprising the steps of:
    forming a first semiconductor layer having an island shape on an insulating surface;
    forming a gate electrode over a channel formation region of the first semiconductor layer with a gate insulating layer interposed therebetween;
    introducing an impurity element into a portion of the first semiconductor layer;
    forming a second semiconductor layer in direct contact with the portion of the first semiconductor layer and the insulating surface;
    performing a first heat treatment to the first semiconductor layer and the second semiconductor layer, thereby forming a third semiconductor layer in which a thickness of the channel formation region is smaller than a thickness of a source region; and
    performing a second heat treatment for thermal activation of the impurity element.

13. The method for manufacturing the semiconductor device according to claim 12, wherein the first heat treatment is performed by a thermal annealing method.

14. The method for manufacturing the semiconductor device according to claim 12, wherein the first semiconductor layer is a single-crystal silicon layer.

15. The method for manufacturing the semiconductor device according to claim 12, wherein the first semiconductor layer is a layer formed by crystallizing an amorphous semiconductor layer using a heat treatment.

16. The method for manufacturing the semiconductor device according to claim 12, wherein the second semiconductor layer comprises an amorphous semiconductor layer.

17. The method for manufacturing the semiconductor device according to claim 12, wherein epitaxial growth of the second semiconductor layer occurs in the first heat treatment.

18. A method for manufacturing a semiconductor device comprising the steps of:
    forming a first semiconductor layer having an island shape on an insulating surface;
    forming a gate electrode over a channel formation region of the first semiconductor layer with a gate insulating layer interposed therebetween;
    introducing an impurity element into a portion of the first semiconductor layer;
    forming a second semiconductor layer in direct contact with the portion of the first semiconductor layer and the insulating surface;
    performing a first heat treatment to the first semiconductor layer and the second semiconductor layer so that crystal growth of the second semiconductor layer occurs, thereby forming a third semiconductor layer in which a thickness of the channel formation region is smaller than a thickness of a source region; and
    performing a second heat treatment for thermal activation of the impurity element.

19. The method for manufacturing the semiconductor device according to claim 18, wherein the first heat treatment is performed by a thermal annealing method.

20. The method for manufacturing the semiconductor device according to claim 18, wherein the first semiconductor layer is a single-crystal silicon layer.

21. The method for manufacturing the semiconductor device according to claim 18, wherein the first semiconductor layer is a layer formed by crystallizing an amorphous semiconductor layer using a heat treatment.

22. The method for manufacturing the semiconductor device according to claim 18, wherein the second semiconductor layer comprises an amorphous semiconductor layer.

* * * * *

UNITED STATES PATENT AND TRADEMARK OFFICE
CERTIFICATE OF CORRECTION

| | | |
|---|---|---|
| PATENT NO. | : 8,048,729 B2 | Page 1 of 1 |
| APPLICATION NO. | : 12/838125 | |
| DATED | : November 1, 2011 | |
| INVENTOR(S) | : Hideto Ohnuma | |

It is certified that error appears in the above-identified patent and that said Letters Patent is hereby corrected as shown below:

ON THE TITLE PAGE:

Item (57) In the Abstract, line 6, "concave-convex shape" should read "concavo-convex shape"

In the Specification,

Col. 4, line 31, "2031 b" should read "203b"

Col. 5, line 1, "concave-convex shape is feinted" should read "concavo-convex shape is formed"

Col. 6, line 38, "island shape can be fox wed" should read "island shape can be formed"

Col. 9, line 34, "the impurity region 22e" should read "the impurity region 22c"

Col. 9, line 57, "electrically Connect" should read "electrically connect"

Col. 10, line 10, "($SiO_xN_y$, where x>y>0) that is foamed" should read "($SiO_xN_y$, where x>y>0) that is formed"

Col. 15, line 61, "from 20urn to 50nm" should read "from 20nm to 50 nm"

Col. 16, line 15, "a gate electrode are fainted over" should read "a gate electrode are formed over"

Col. 21, line 66, "such as polyimide, polyimide" should read "such as polyimide, polyamide"

Col. 23, line 13, "the insulating layer 766 is fainted" should read "the insulating layer 766 is formed"

Signed and Sealed this
Thirteenth Day of March, 2012

David J. Kappos
*Director of the United States Patent and Trademark Office*